United States Patent [19]
Nysen

[11] Patent Number: 5,986,382
[45] Date of Patent: Nov. 16, 1999

[54] SURFACE ACOUSTIC WAVE TRANSPONDER CONFIGURATION

[75] Inventor: Paul A. Nysen, Sunnyvale, Calif.

[73] Assignee: X-Cyte, Inc., San Jose, Calif.

[21] Appl. No.: 08/914,284

[22] Filed: Aug. 18, 1997

[51] Int. Cl.$^6$ .............................. H03H 9/30; G01S 13/75
[52] U.S. Cl. .................................. 310/313 D; 310/313 R; 333/156; 333/157; 342/51
[58] Field of Search .......................... 310/313 D, 313 R; 333/156, 157, 195; 342/51

[56] References Cited

U.S. PATENT DOCUMENTS

| | | | |
|---|---|---|---|
| 2,817,012 | 12/1957 | Kendall | 342/42 |
| 3,025,524 | 3/1962 | Thies | 343/823 |
| 3,209,350 | 9/1965 | Davis et al. | 340/825.34 |
| 3,273,146 | 9/1966 | Hurwitz | 342/51 |
| 3,513,470 | 5/1970 | Rabow | 342/51 |
| 3,521,280 | 7/1970 | Janco et al. | 342/44 |
| 3,600,710 | 8/1971 | Adler | 333/72 |
| 3,665,480 | 5/1972 | Fassett | 343/754 |
| 3,689,929 | 9/1972 | Moody | 343/802 |
| 3,706,094 | 12/1972 | Cole et al. | 343/6.5 SS |
| 3,737,911 | 6/1973 | Sakuragi et al. | 343/6.5 SS |
| 3,755,803 | 8/1973 | Cole et al. | 340/280 |
| 3,801,935 | 4/1974 | Mitchell | 333/72 |
| 3,810,257 | 5/1974 | Jones et al. | 333/30 R |
| 3,845,420 | 10/1974 | Holland et al. | 333/30 R |
| 3,845,490 | 10/1974 | Manwarren et al. | 343/821 |
| 3,869,682 | 3/1975 | Heeks et al. | 332/11 R |
| 3,870,994 | 3/1975 | McCormick et al. | 343/6.5 R |
| 3,878,528 | 4/1975 | Majeau | 343/6.5 SS |
| 3,898,592 | 8/1975 | Solie | 333/72 |
| 3,909,838 | 9/1975 | Beyerlein | 357/70 |
| 3,931,597 | 1/1976 | Cho et al. | 333/30 R |
| 3,936,774 | 2/1976 | Mellon et al. | 333/30 R |
| 3,961,290 | 6/1976 | Moore | 333/30 R |
| 3,967,121 | 6/1976 | Cooper et al. | 333/195 |
| 3,981,011 | 9/1976 | Bell, III | 343/6.5 LC |
| 4,003,073 | 1/1977 | Helda et al. | 357/70 |

(List continued on next page.)

FOREIGN PATENT DOCUMENTS

| | | | |
|---|---|---|---|
| B 6661181 | 1/1980 | Australia | G01K 11/22 |
| 3400184 | 10/1984 | Australia | H04B 1/59 |
| A 2189788 | 9/1987 | Australia | G07C 5/00 |
| 8900470 | 11/1989 | Australia | H03H 9/145 |
| 9000043 | 2/1990 | Australia | H04B 1/59 |
| 1228911 | 11/1987 | Canada | G01S 9/145 |
| 1228912 | 11/1987 | Canada | G01S 13/80 |
| 0513007 | 11/1990 | European Pat. Off. | H03H 9/02 |
| 2521290 | 5/1975 | Germany | H03H 9/145 |
| 23 63 701 | 6/1975 | Germany | 333/195 |
| 2524571 | 6/1975 | Germany | H04B 7/15 |
| 2604105 | 2/1976 | Germany | H03H 9/00 |
| 2813753 | 3/1978 | Germany | G01S 9/56 |
| 0089617 | 3/1983 | Germany | H03H 9/145 |
| 3438051 | 10/1984 | Germany | G01S 13/74 |
| 55-44253 | 3/1980 | Japan | 333/195 |
| 56-122215 | 9/1981 | Japan | H03H 9/145 |
| 56-53817 | 11/1981 | Japan | H03H 9/145 |
| 847909 | 6/1985 | South Africa . | |
| 847910 | 6/1985 | South Africa . | |
| 1298381 | 2/1969 | United Kingdom | H04B 7/00 |
| 1413486 | 12/1972 | United Kingdom | H03B 5/32 |
| 2165411 | 10/1984 | United Kingdom | H03H 9/42 |
| 2165423 | 10/1984 | United Kingdom | H04B 1/59 |
| 2165425 | 10/1984 | United Kingdom | H03B 23/00 |
| 2142475 | 1/1985 | United Kingdom | H04B 1/59 |
| WO 80/02485 | 11/1980 | WIPO | H03H 9/145 |

*Primary Examiner*—Thomas M. Dougherty
*Attorney, Agent, or Firm*—Milde, Hoffberg & Macklin, LLP

[57] ABSTRACT

An acoustic wave identification transponder device, having a substrate, an electroacoustic transducer generating an acoustic wave in said substrate and a set of encoding elements disposed in a path of the acoustic wave for modifying the acoustic wave, having at least two reflective elements disposed in the acoustic path of the acoustic wave such that an acoustic path length of the acoustic wave on the substrate is longer than twice a largest linear dimension of the substrate. The device preferably includes an angled elongated conductor formed on said substrate, having angle magnitudes whose sum exceeds π radians, said angled elongated conductor defining at least a portion of the acoustic path.

29 Claims, 10 Drawing Sheets

U.S. PATENT DOCUMENTS

| | | | |
|---|---|---|---|
| 4,023,167 | 5/1977 | Wahlstrom | 343/6.5 SS |
| 4,028,649 | 6/1977 | Komatsu et al. | 333/72 |
| 4,044,355 | 8/1977 | Edvardsson | 343/14 |
| 4,058,217 | 11/1977 | Vaughan et al. | 209/74 M |
| 4,059,831 | 11/1977 | Epstein | 343/6.8 R |
| 4,069,472 | 1/1978 | Kamata et al. | 346/146.3 K |
| 4,072,915 | 2/1978 | Mitchell | 333/72 |
| 4,096,477 | 6/1978 | Epstein et al. | 343/6.5 SS |
| 4,106,020 | 8/1978 | Johnson | 343/14 |
| 4,110,653 | 8/1978 | Hartemann | 310/313 |
| 4,138,681 | 2/1979 | Davidson et al. | 343/702 |
| 4,141,712 | 2/1979 | Rogers | 65/36 |
| 4,143,340 | 3/1979 | Hunsinger | 333/151 |
| 4,151,525 | 4/1979 | Strauch et al. | 343/6.5 R |
| 4,155,056 | 5/1979 | Cross et al. | 333/195 |
| 4,155,057 | 5/1979 | Sandy et al. | 333/195 |
| 4,166,228 | 8/1979 | Solie | 310/313 D |
| 4,166,258 | 8/1979 | Tseng | 333/195 |
| 4,180,815 | 12/1979 | Hill | 343/6.5 R |
| 4,201,964 | 5/1980 | Noro et al. | 333/151 |
| 4,213,104 | 7/1980 | Cullen et al. | 333/150 |
| 4,217,564 | 8/1980 | Autran | 333/152 |
| 4,234,666 | 11/1980 | Gursky | 428/573 |
| 4,241,352 | 12/1980 | Alspaugh et al. | 343/700 MS |
| 4,242,671 | 12/1980 | Plows | 340/572 |
| 4,242,685 | 12/1980 | Sanford | 343/770 |
| 4,259,673 | 3/1981 | Guretzky | 343/825 |
| 4,260,988 | 4/1981 | Yanagisawa et al. | 343/700 MS |
| 4,263,571 | 4/1981 | Kinoshita et al. | 333/194 |
| 4,263,595 | 4/1981 | Vogel | 343/6.5 SS |
| 4,267,534 | 5/1981 | Tanski | 333/153 |
| 4,288,343 | 9/1981 | Louderback | 252/408 |
| 4,288,689 | 9/1981 | Lemelson et al. | 235/435 |
| 4,297,701 | 10/1981 | Henriques | 343/6.5 LC |
| 4,307,356 | 12/1981 | Arai | 333/194 |
| 4,319,154 | 3/1982 | Solie | 310/313 D |
| 4,320,402 | 3/1982 | Bowen | 343/700 MS |
| 4,330,790 | 5/1982 | Burns | 357/70 |
| 4,331,740 | 5/1982 | Burns | 428/572 |
| 4,339,753 | 7/1982 | Mawhinney | 343/6.5 SS |
| 4,388,524 | 6/1983 | Walton | 235/380 |
| 4,400,702 | 8/1983 | Tanaka | 343/790 |
| 4,410,823 | 10/1983 | Miller et al. | 310/313 D |
| 4,422,055 | 12/1983 | Cullen et al. | 333/151 |
| 4,423,392 | 12/1983 | Wolfson | 333/116 |
| 4,434,383 | 2/1984 | Cho et al. | 310/313 R |
| 4,462,011 | 7/1984 | Ward | 333/154 |
| 4,477,813 | 10/1984 | Weiss | 343/700 MS |
| 4,480,150 | 10/1984 | Jones et al. | 174/52 FP |
| 4,484,160 | 11/1984 | Riha | 333/195 |
| 4,494,031 | 1/1985 | Barnes et al. | 310/313 R |
| 4,554,549 | 11/1985 | Fassett et al. | 343/700 MS |
| 4,589,422 | 5/1986 | James et al. | 128/804 |
| 4,591,815 | 5/1986 | Schofield | 333/195 |
| 4,604,623 | 8/1986 | Skeie | 343/6.8 R |
| 4,605,929 | 8/1986 | Skeie | 343/6.8 R |
| 4,618,841 | 10/1986 | Riha | 333/195 |
| 4,620,191 | 10/1986 | Skeie | 342/51 |
| 4,623,890 | 11/1986 | Nysen | 342/44 |
| 4,625,184 | 11/1986 | Niitsuma et al. | 333/150 |
| 4,625,207 | 11/1986 | Skeie | 342/51 |
| 4,625,208 | 11/1986 | Skeie et al. | 342/51 |
| 4,642,640 | 2/1987 | Woolsey et al. | 342/42 |
| 4,644,384 | 2/1987 | Charoensakvirochana | 357/74 |
| 4,672,418 | 6/1987 | Moran et al. | 357/70 |
| 4,699,682 | 10/1987 | Takishima | 156/292 |
| 4,703,327 | 10/1987 | Rossetti et al. | 342/44 |
| 4,706,105 | 11/1987 | Masuda et al. | 357/74 |
| 4,724,443 | 2/1988 | Nysen | 343/700 MS |
| 4,725,841 | 2/1988 | Nysen et al. | 342/44 |
| 4,734,698 | 3/1988 | Nysen et al. | 342/44 |
| 4,737,789 | 4/1988 | Nysen | 342/51 |
| 4,737,790 | 4/1988 | Skeie et al. | 342/51 |
| 4,739,328 | 4/1988 | Koelle et al. | 342/44 |
| 4,745,401 | 5/1988 | Montean | 340/572 |
| 4,782,345 | 11/1988 | Landt | 343/727 |
| 4,786,907 | 11/1988 | Koelle | 342/51 |
| 4,791,416 | 12/1988 | Adler | 310/313 D |
| 4,800,392 | 1/1989 | Garay et al. | 343/700 MS |
| 4,816,839 | 3/1989 | Landt | 343/795 |
| 4,845,397 | 7/1989 | Herrick et al. | 310/348 |
| 4,853,705 | 8/1989 | Landt | 343/803 |
| 4,864,158 | 9/1989 | Koelle et al. | 307/231 |
| 4,888,591 | 12/1989 | Landt et al. | 342/44 |
| 4,912,471 | 3/1990 | Tyburski et al. | 342/42 |
| 4,931,664 | 6/1990 | Knoll | 307/10.3 |
| 4,933,588 | 6/1990 | Greer | 310/313 D |
| 4,951,057 | 8/1990 | Nagel | 342/51 |
| 4,999,636 | 3/1991 | Landt et al. | 342/90 |
| 5,019,815 | 5/1991 | Lemelson et al. | 340/933 |
| 5,027,107 | 6/1991 | Matsuno et al. | 340/572 |
| 5,030,807 | 7/1991 | Landt et al. | 235/375 |
| 5,055,659 | 10/1991 | Hendrick et al. | 235/439 |
| 5,095,240 | 3/1992 | Nysen et al. | 310/313 R |
| 5,130,597 | 7/1992 | Mariani | 310/313 D |
| 5,144,313 | 9/1992 | Kirknes | 342/44 |
| 5,182,570 | 1/1993 | Nysen et al. | 343/795 |
| 5,365,206 | 11/1994 | Machui et al. | 333/195 |
| 5,365,770 | 11/1994 | Meitzler et al. | 73/24.06 |
| 5,654,693 | 8/1997 | Cocita | 340/572 |

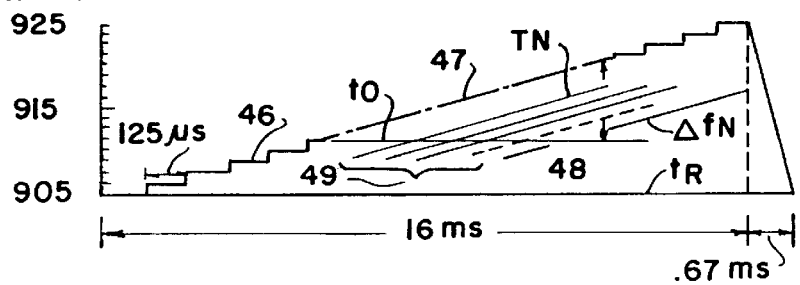
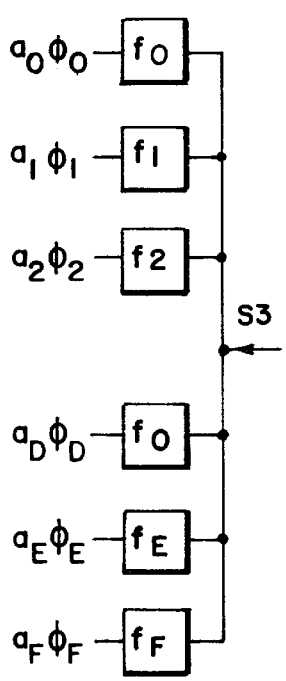
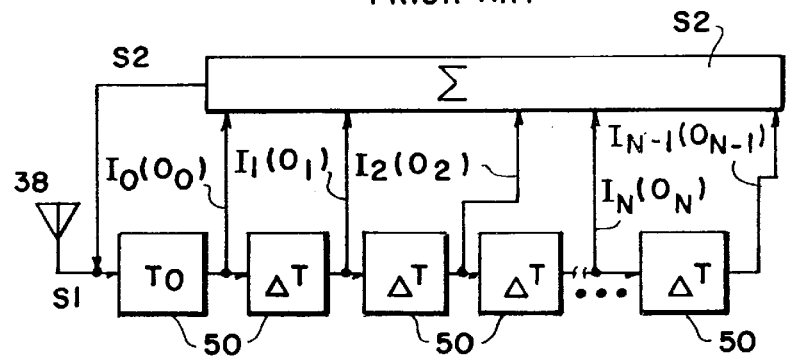
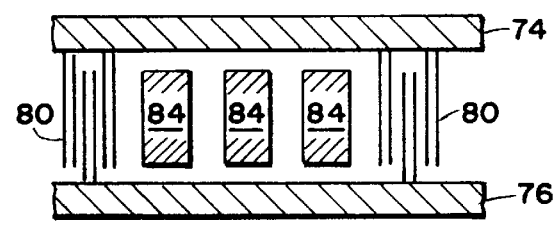
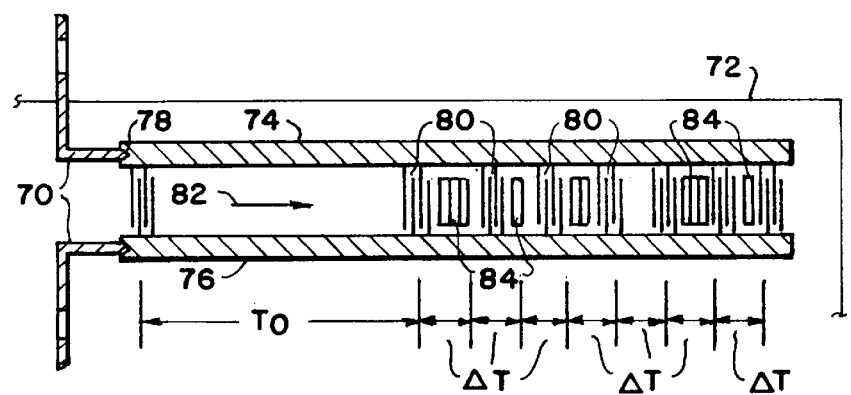

INFORMATION CELL DISTRIBUTED OVER TIME AND FREQUENCY

Bx

Tf      TI

|← TI-Tf →|

3μs      23μs

902MHz

INFORMATION CELLS DISTRIBUTED OVER TIME ONLY

IMAG    ENCODED LOCATION FOR INFORMATION CELL

REAL

QAM (16) ENCODING
RECTANGULAR MODULATION

IMAG    ENCODED LOCATION FOR INFORMATION CELL

1

REAL

1 CELL NOT USED
QAM (18) ENCODING
POLAR MODULATION
(BETTER SUITED SAW APPLICATION)

BEAM PATTERN COVERAGE USING PATCH LIKE ANTENNA (PROJECTION VIEW)

POLARIZATION AXES
POLARIZATION COVERAGE

SPATIAL DISCRIMINA
-TION MULTI-READ
POINTS
SPATIAL COVERAGE

R = READERS fm = Tr
$t_{SWEEP}$ = SWEEP TIME
$1/t_{SWEEP}$ = NOISE BANDWIDTH OF DETECTOR

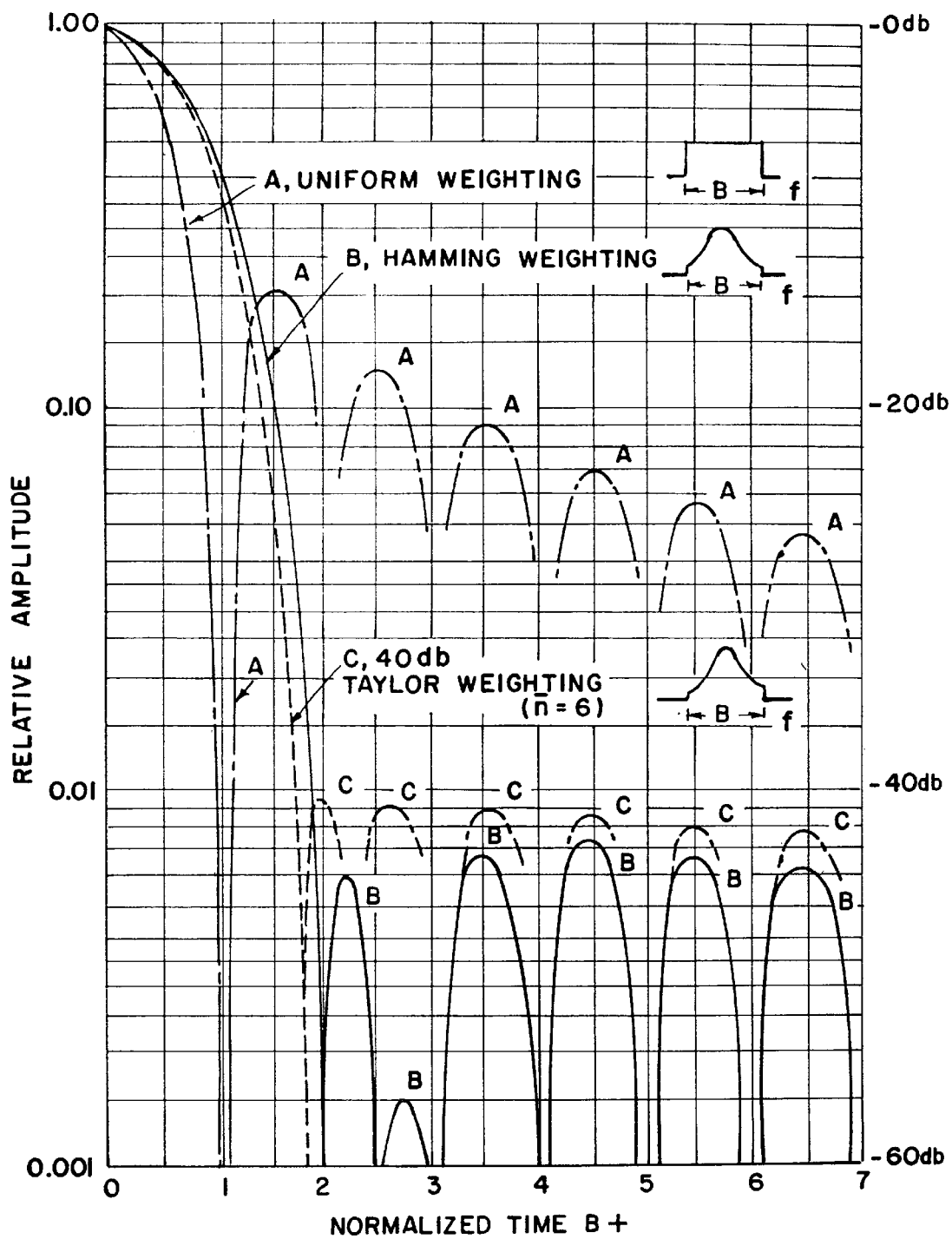

SURFACE ACOUSTIC WAVE TRANSPONDER CONFIGURATION

FIELD OF THE INVENTION

The present invention relates to new configuration of a surface acoustic wave transponder, and more particularly to a surface acoustic wave transponder having a folded acoustic path reducing a size of the otherwise required substrate.

BACKGROUND OF THE INVENTION

A known acoustic radio frequency transponder system produces individualized responses to an interrogation signal. The code space for these devices may be, for example, $2^{12}$ codes, or more, allowing a large number of separate transponders to be produced without code reuse. These devices provide a piezoelectric substrate on which an aluminum pattern is formed, for example by a typical microphotolithography process, with a minimum feature size of, for example, one micron. As discussed more fully below, the metallized pattern defines a set of antenna pickups, electroacoustic transducers, acoustic paths, and elements which interact with the acoustic wave to produce an encoding of an acoustic wave which is converted to an electromagnetic wave and retransmitted.

The transponder devices thus include an acoustic wave device, generally operating with surface acoustic waves, in which an identification code is provided as a characteristic time-domain reflection, attenuation, phase delay, and/or transducer interaction pattern in a retransmitted signal, in a system which generally requires that the signal emitted from an exciting antenna be non-stationary with respect to a signal received from the tag. This ensures that the reflected signal pattern is distinguished from the emitted signal. In such a device, received RF energy, possibly with harmonic conversion, is emitted onto a piezoelectric substrate as an acoustic wave with an interdigital electrode system, from whence it travels through the substrate, interacting with reflector elements in the path of the wave. A portion of the acoustic wave is ultimately received by the same or a separate interdigital electrode system and retransmitted. These devices typically do not require a semiconductor memory. The propagation velocity of an acoustic wave in a surface acoustic wave device is slow as compared to the free space propagation velocity of a radio wave. Thus, assuming that the time for transmission between the radio frequency interrogation system is short as compared to the acoustic delay, the interrogation frequency typically changes by an amount sufficient such that a return signal having a minimum delay may be distinguished from the simultaneously transmitted interrogation signal, and in a manner that the interrogation frequency does not return to the same frequency during a period longer than the maximum acoustic delay period. Generally, such systems are interrogated with a pulse transmitter or chirp frequency system.

Systems for interrogating a passive transponder employing acoustic wave devices, carrying amplitude and/or phase-encoded information are disclosed in, for example, U.S. Pat. Nos. 4,059,831; 4,484,160; 4,604,623; 4,605,929; 4,620,191; 4,623,890; 4,625,207; 4,625,208; 4,703,327; 4,724,443; 4,725,841; 4,734,698; 4,737,789; 4,737,790; 4,951,057; 5,095,240; and 5,182,570, expressly incorporated herein by reference.

Because the encoded information normally includes an identification code which is unique or quasi-unique to each transponder, and because the transponders of this type are relatively light weight and small and may be easily attached to other objects to be identified, the transponders are sometimes referred to as "labels" or "tags". The entire system, including the interrogator/receiver apparatus and one or more transponders, which may be active or passive, is therefore often referred to as a "passive interrogator label system" or "PILS". Other types of passive interrogator label systems are disclosed, for example, in the U.S. Pat. Nos. 3,273,146; 3,706,094; 3,755,803; and 4,058,217, incorporated herein by reference.

When an acoustic wave pulse is reconverted into an electrical signal, it is supplied to an antenna on the transponder and transmitted as RF electromagnetic energy. This energy is received at a receiver and decoder, typically at the same location as the interrogating transmitter, and the information contained in this response to an interrogation signal is decoded. The tag typically has but a single antenna, used for both receiving the interrogation pulse and emitting an information bearing signal, but known systems employ multiple antennas.

In systems of this general type, the information code associated with and which identifies the passive transponder is built into the transponder at the time that a layer of metallization is finally defined on the substrate of piezoelectric material. This metallization thus defines the antenna coupling, launch transducers, acoustic pathways and information code elements, e.g., reflectors. Thus, the information code in this case is non-volatile and permanent. Since the transponder typically remains static over time, the encoded information may be retrieved by a single interrogation cycle. The information is present in the return signal as a set of characteristic perturbations of the interrogation signal, such as delay pattern and attenuation. In the case of a tag having launch transducers and a variable pattern of reflective elements, the number of possible codes is $N \times 2^M$ where N is the number of acoustic waves launched by the transducers and M is the number of reflective element positions for each transducer. Thus, with four launch transducers each emitting two acoustic waves, and a potential set of eight variable reflective elements in each acoustic path, the number of differently coded transducers is 2048. Therefore, for a large number of potential codes, it is necessary to provide a large number of launch transducers and/or a large number of reflective elements. However, efficiency is lost with increasing complexity, and a large number of distinct acoustic waves reduces the signal strength of the signal encoding the information in each.

The transponder tag thus includes a multiplicity of "signal conditioning elements", i.e., delay elements, reflectors, and/or amplitude modulators, are coupled to receive the first signal from a transponder antenna. Each signal conditioning element provides an intermediate signal having a known delay and a known amplitude modification to the first signal. Even where the signal is split into multiple portions, it is advantageous to reradiate the multiple portions of the signal through a single antenna. Therefore, a single "signal combining element" coupled to all of the signal conditioning elements and/or signal portions is provided for combining the intermediate signals to produce the second signal. This second signal is coupled out to the same or a separate antenna for transmission as a reply signal. As described above, the signal delay elements and/or the signal combining element impart a known, unique informational code to the second signal.

In the acoustic wave tags described above, the interrogator transmits a first signal that successively assumes a plurality of frequency values within a prescribed frequency range. This frequency range or band may, for example, be about 905–925 MHz, referred to herein as the 915 MHz band. Traditionally, the 915 MHz band has been available for unlicensed use, however, other or conflicting uses of this band may make other bands more attractive in the future.

Preferably, the passive acoustic wave transponder tag includes at least one element having predetermined characteristics, which assists in synchronizing the receiver and allows for temperature compensation of the system. As the temperature rises, the piezoelectric substrate may expand and contract, altering the characteristic delays and other parameters of the tag. Variations in the transponder response due to changes in temperature thus result, in part, from the thermal expansion of the substrate material. Although propagation distances are small, an increase in temperature of only 20° C. can produce an increase in propagation time by the period of one entire cycle at a transponder frequency of about 915 MHz. The acoustic wave is often a surface acoustic wave, although bulk acoustic wave devices may also be constructed.

The transponder is constructed such that $i^{th}$ delay time $t_i = T_0 + K\Delta T + \Delta V_i$, where K is a proportionality constant, $\Delta T$ is the nominal, known difference in delay time between the intermediate signals of two particular successive ones of the signal delay elements in the group, and $\Delta V_i$, is a modification factor due to inter-transponder variations, such as manufacturing variations. By measuring the quantities $\Delta T$ and $\Delta V_i$, it is possible to determine the expected delay time $t_i - T_0$ for each and every signal delay element from the known quantities K, $\Delta T$ and $\Delta V_i$. The manufacturing variations $\Delta V_i$ are comprised of a "mask" variation $\Delta M_i$ due to possible imperfections in the photolithographic mask; an "offset" variation $\Delta O_i$ which arises from the manufacturing process used to deposit the metal layer on the piezoelectric substrate; and a random variation $\Delta R_i$ which is completely unpredictable but usually neglectably small. Specific techniques are available for determining and compensating both the mask variations $\Delta M_i$ and the offset variations $\Delta O_i$.

This surface acoustic wave transponder system provides a number of advantages, including high signal-to-noise performance, and the fact that the output of the signal mixer—namely, the signal which contains the difference frequencies of the first (interrogating) signal and the second (reply) signal—may be transmitted over inexpensive, shielded, twisted-pair wires because these frequencies are, for example, typically in the audio range. Furthermore, since the audio signal is not greatly attenuated or dispersed when transmitted over relatively long distances, the signal-processor may be located at a remote location from the signal mixer, or provided as a central processing site for multiple interrogator antennae.

Passive transponder encoding schemes include control over interrogation signal transfer function H(s) and delay functions f(z). These functions therefore typically generate a return signal in the same band as the interrogation signal. Since the return signal is mixed with the interrogation signal, the difference between the two will generally define the information signal, along with possible interference and noise. By controlling the rate of change of the interrogation signal frequency with respect to a maximum round trip propagation delay, including internal delay, as well as possible Doppler shift, the maximum bandwidth of the demodulated signal may be controlled.

Transponders which include an identification based on elements which alter a response of a SAW device are susceptible to interference which reduces the signal-to-noise ratio of the reply signal that is transmitted by the transponder antenna back to the interrogator. Interference may be caused by reflections from various metallized elements disposed on the surface of the SAW device in the acoustic wave travel paths. The amplitudes of such reflections are directly proportional to the change in velocity, $\Delta V$, of a surface acoustic wave as it passes from a metallization-free surface area on the SAW device to a metallized surface area and vice versa. Such surface acoustic wave reflections are reconverted into electrical signals by the transducers in their paths of travel, resulting in spurious electrical signals that appear as noise in the transmitted reply signal.

A known surface acoustic wave passive interrogator label system, as described, for example, in U.S. Pat. Nos. 4,734698; 4,737,790; 4,703,327; and 4,951,057, and shown in FIG. 1, includes an interrogator comprising a voltage controlled oscillator 10 which produces a first signal S1 at a radio frequency determined by a control voltage V supplied by a control unit 12. This signal S1 is amplified by a power amplifier 14 and applied to an antenna 16 for transmission to a transponder 20.

The signal S1 is received at the antenna 18 of the transponder 20 and passed to a signal transforming element 22. This signal transformer converts the first (interrogation) signal S1 into a second (reply) signal S2, encoded with an information pattern. The information pattern is encoded as a series of elements having characteristic delay periods $T_0$ and $\Delta T_1, \Delta T_2, \ldots \Delta T_N$. Two common types of systems exist. In a first, the delay periods correspond to physical delays in the propagation of the acoustic signal. After passing each successive delay, a portion of the signal $I_0, I_1, I_2 \ldots I_N$ is tapped off and supplied to a summing element. The resulting signal S2, which is the sum of the intermediate signals $I_0 \ldots I_N$, is fed back to a transponder tag antenna, which may be the same or different than the antenna which received the interrogation signal, for transmission to the interrogator/receiver antenna. In a second system, the delay periods correspond to the positions of reflective elements, which reflect portions of the acoustic wave back to the launch transducer, where they are converted back to an electrical signal and emitted by the transponder tag antenna.

The signal S2 is passed either to the same antenna 18 or to a different antenna 24 for transmission back to the interrogator/receiver apparatus. This second signal S2 carries encoded information which, at a minimum, identifies the particular transponder 20.

The signal S2 is picked up by a receiving antenna 26. Both this second signal S2 and the first signal S1 (or respective signals derived from these two signals) are applied to a mixer (four quadrant multiplier) 30 to produce a third signal S3 containing frequencies which include both the sums and the differences of the frequencies contained in the signals S1 and S2. The signal S3 is passed to a signal processor 32 which determines the amplitude a, and the respective phase $\phi_i$ of each frequency component $\phi_i$ among a set of frequency components ($\phi_0, \phi_1, \phi_2 \ldots$) in the signal S3. Each phase $\phi_1$ is determined with respect to the phase $\phi_0=0$ of the lowest frequency component $\phi_0$. The signal S3 may be intermittently supplied to the mixer by means of a switch.

The information determined by the signal processor 32 is passed to a computer system comprising, among other elements, a random access memory (RAM) 34 and a microprocessor 36. This computer system analyzes the frequency, amplitude and phase information and makes decisions based upon this information. For example, the computer system may determine the identification number of the interrogated transponder 20. This I.D number and/or other decoded information is made available at an output 38.

The transponder serves as a signal transforming element 22, which comprises N+1 signal conditioning elements 40 and a signal combining element 42. The signal conditioning elements 40 are selectively provided to impart a different response code for different transponders, and which may involve separate intermediate signals $I_0, I_1 \ldots I_N$ within the transponder. Each signal conditioning element 40 comprises a known delay $T_i$ and a known amplitude modification $A_i$ (either attenuation or amplification). The respective delay $T_i$ and amplitude modification $A_i$ may be functions of the frequency of the received signal S1, or they may provide a constant delay and constant amplitude modification, respectively, independent of frequency. The time delay and amplitude modification may also have differing dependency on frequency. The order of the delay and amplitude modification elements may be reversed; that is, the amplitude modification elements $A_i$ may precede the delay elements $T_i$. Amplitude modification $A_i$ can also occur within the path $T_i$.

The signals are combined in combining element 42 which combines these intermediate signals (e.g., by addition, multiplication or the like) to form the reply signal S2 and the combined signal emitted by the antenna 18.

In one embodiment, as shown in FIG. 2, the voltage controlled oscillator 10 is controlled to produce a sinusoidal RF signal with a frequency that is swept in 128 equal discrete steps from 905 MHz to 925 MHz. Each frequency step is maintained for a period of 125 microseconds so that the entire frequency sweep is carried out in 16 milliseconds. Thereafter, the frequency is dropped back to 905 MHz in a relaxation period of 0.67 milliseconds. The stepwise frequency sweep 46 shown in FIG. 3B thus approximates the linear sweep 44 shown in FIG. 3A.

Assuming that the stepwise frequency sweep 44 approximates an average, linear frequency sweep or "chirp" 47, FIG. 3B illustrates how the transponder 20, with its known, discrete time delays $T_0, T_1 \ldots T_N$ produces the second (reply) signal 52 with distinct differences in frequency from the first (interrogation) signal 51. Assuming a round-trip, radiation transmission time of $t_0$, the total round-trip times between the moment of transmission of the first signal and the moments of reply of the second signal will be to $t_0+T_0, t_0+T_1, \ldots t_0+T_N$, for the delays $T_{ON}, T_1 \ldots, T_1$ respectively. Considering only the transponder delay $T_N$, at the time $t_R$ when the second (reply) signal is received at the antenna 26, the frequency 48 of this second signal will be $\Delta f_N$ less than the instantaneous frequency 47 of the first signal S1 transmitted by the antenna 16. Thus, if the first and second signals are mixed or "homodyned", this frequency difference $\Delta f_N$ will appear in the third signal as a beat frequency. Understandably, other beat frequencies will also result from the other delayed frequency spectra 49 resulting from the time delays $T_0, T_1 \ldots T_{N-1}$. Thus, in the case of a "chirp" waveform, the difference between the emitted and received waveform will generally be constant. In mathematical terms, we assume that the phase of a transmitted interrogation signal is $\phi=2\pi f\tau$, where $\tau$ is the round-trip transmission time delay. For a ramped frequency df/dt or f, we have: $2\pi f\tau = d\phi/dt = \omega$. $\omega$, the beat frequency, is thus determined by $\tau$ for a given ramped frequency or chirp f. In this case, the signal S3 may be analyzed by determining a frequency content of the S3 signal, for example by applying it to sixteen bandpass filters, each tuned to a different frequency, $f_0, f_1 \ldots f_E, f_F$. The signal processor determines the amplitude and phase of the signals that pass through these respective filters. These amplitudes and phases contain the code or "signature" of the particular signal transformer 22 of the interrogated transponder 20. This signature may be analyzed and decoded in known manner.

In one embodiment of a passive transponder, shown in FIGS. 6 and 7, the internal circuit operates to convert the received signal S1 into an acoustic wave and then to reconvert the acoustic energy back into an electrical signal S2 for transmission via a dipole antenna 70, connected to, and arranged adjacent a SAW device made of a substrate 72. More particularly, the signal transforming element of the transponder includes a substrate 72 of piezoelectric material such as a lithium niobate ($LiNbO_3$) crystal, which has a free surface acoustic wave propagation velocity of about 3488 meters/second. On the surface of this substrate is deposited a layer of metal, such as aluminum, forming a pattern which includes transducers and delay/reflective elements.

One transducer embodiment includes a pattern consisting of two bus bars 74 and 76 connected to the dipole antenna 70, a "launch" transducer 78 and a plurality of "tap" transducers 80. The bars 74 and 76 thus define a path of travel 82 for a surface acoustic wave which is generated by the launch transducer and propagates substantially linearly, reaching the tap transducers each in turn. The tap transducers convert the surface acoustic wave back into electrical energy which is collected and therefore summed by the bus bars 74 and 76. This electrical energy then activates the dipole antenna 70 and is converted into electromagnetic radiation for transmission as the signal S2.

The tap transducers 80 are provided at equally spaced intervals along the surface acoustic wave path 82, as shown in FIG. 6, and an informational code associated with the transponder is imparted by providing a selected number of "delay pads" 84 between the tap transducers. These delay pads, which are shown in detail in FIG. 7, are preferably made of the same material as, and deposited with, the bus bars 74, 76 and the transducers 78, 80. Each delay pad has a width sufficient to delay the propagation of the surface acoustic wave from one tap transducer 80 to the next by one quarter cycle or 90° with respect to an undelayed wave at the frequency of operation (in the 915 MHz band). By providing locations for three delay pads between successive tap transducers, the phase f of the surface acoustic wave received by a tap transducer may be controlled to provide four phase possibilities, zero pads=0°; one pad=90°; two pads=180°; and three pads=270°.

The phase information $\phi_0$ (the phase of the signal picked up by the first tap transducer in line), and $\phi_1, \phi_2 \ldots \phi_N$ (the phases of the signals picked up by the successive tap transducers) is supplied to the combiner (summer) which, for example, comprises the bus bars 74 and 76. This phase information, which is transmitted as the signal S2 by the antenna 70, contains the informational code of the transponder.

As shown in FIG. 7, the three delay pads 84 between two tap transducers 80 are each of such a width L as to each provide a phase delay of 90° in the propagation of an acoustic wave from one tap transducer to the next as compared to the phase in the absence of such a delay pad. This width L is dependent upon the material of both the substrate and the delay pad itself as well as upon the thickness of the delay pad and the wavelength of the surface acoustic wave.

The transducers are typically fabricated by an initial metallization of the substrate with a generic encoding, i.e., a set of reflectors or delay elements which may be further modified by removal of metal to yield the customized transponders. Thus, in the case of delay pads, three pads are provided between each set of transducers or taps, some of which may be later removed. Where the code space is large, the substrates may be partially encoded, for example with higher order code elements, so that only the lower order code elements need by modified in a second operation.

While a system of the type described above operates satisfactorily when the number of tap transducers does not exceed eight, the signal to noise ratio in the transponder reply signal is reduced as the number of tap transducers increases. This is because the tap transducers additionally act as launch transducers as well as partial reflectors of the surface acoustic wave so that an increase in the number of tap transducers results in a corresponding increase in spurious signals in the transponder replies. This limitation on the number of tap transducers places a limitation on the length of the informational code imparted in the transponder replies.

Spurious signals as well as insertion losses may be reduced in a passive transponder so that the informational code may be increased in size to any desired length, by providing one or more surface acoustic wave reflectors on the piezoelectric substrate in the path of travel of the surface acoustic wave, to reflect the acoustic waves back toward a transducer for reconversion into an electric signal.

A transducer 86 may thus be employed in conjunction with reflectors 88 and 90 in a unique configuration which replaces the aforementioned arrangement having a launch transducer 78 and tap transducers 80. In particular, the transducer 86 is constructed to convert electrical energy received at the terminals 92 and 94 into surface acoustic wave energy which propagates outward in opposite directions indicated by the arrows 96 and 98. The launch transducer is constructed in a well known manner with an inter-digital electrode assembly formed of individual electrode fingers arranged between and connected to the two bus bars 100 and 102. In the illustrated pattern, half the fingers are connected to the bus bar 100 and the other half are connected to the bus bar 102. Each electrode is connected to one or the other bus bar and extends toward a free end in the direction of the other bus bar. The distance between the centers of successive fingers is equal to $3\lambda/4$ where $\lambda$ is the center wavelength of the surface acoustic wave. Furthermore, as may be seen, the length of the active region between the ends of the electrodes connected to the bus bar 100 and the ends of the electrodes connected to the bus bar 102 is $K\lambda$, where $K$ is a proportionality constant.

Surface acoustic waves may encounter frequency selective filtering structures, partial reflectors, fill reflectors, phase delay pads or electroacoustic transducing elements as they travel across the substrate, which is typically lithium niobate ($LiNbO_3$) which has a surface acoustic wave propagation velocity of 3488 m/sec and is piezoelectric. The system may have a single acoustic path or sets of acoustic paths which are, for example, parallel, as shown in FIG. 8A.

A wavefront produced by reflections from the leading and trailing edges of transducer fingers will be formed by the superposition of a first wave reflected from the first leading edge and successive waves reflected from successive edges and having differences in phase, with respect to the first wave, of $-\lambda/4, \lambda/2, -3\lambda/4, \lambda$, etc. As may be seen, the wave components having a phase $-\lambda/4, \lambda/2$ and $-3\lambda/4$ effect a cancellation, or at least an attenuation of the wave component reflected from the leading edge. The interdigital fingers of the transducers may therefore be advantageously split to reduce reflections. Conventional interdigital finger transducers which are constructed to operate at a fundamental, resonant frequency of 915 MHz, have a finger width ($\lambda/4$) of approximately 1 micron; a size which approaches the resolution limit of certain photolithographic fabrication techniques (the selective removal of metallization by (1) exposure of photoresist through a mask and (2) subsequent etching of the metallized surface to selectively remove the metal between and outside the transducer fingers). If the fingers are split, the width of each finger ($\lambda/8$) for a fundamental frequency of 915 MHz would be approximately 0.5 micron. The size would require sophisticated photolithographic fabrication techniques. In order to increase the feature sizes, the transducers in the transponder are constructed with a resonant frequency $f_0$ of 305 MHz. In this case, the width of each finger is three times larger than transducer fingers designed to operate at 915 MHz, so that the width ($\lambda/8$) of the split fingers is approximately 1.5 microns. This is well within the capability of typical photolithographic fabrication techniques. Although such transducers are constructed with a resonant frequency of 305 MHz, they are nevertheless driven at the interrogation frequency of approximately 915 MHz; i.e., a frequency $3f_0$ which is the third harmonic of 305 MHz. The energy converted by a transducer, when driven in its third harmonic $3f_0$ (915 MHz), is about $\frac{1}{3}$ of the energy that would be converted if the transducer were driven at its fundamental frequency $f_0$ (305 MHz). Accordingly, it is necessary to construct the transducers to be as efficient as possible within the constraints imposed by the system. As is well known, it is possible to increase the percentage of energy converted, from electrical energy to SAW energy and vice versa, by increasing the number of fingers in a transducer. In particular, the converted signal amplitude is increased by about 2% for each pair of transducer fingers (either conventional fingers or split fingers) so that, for 20 finger pairs for example, the amplitude of the converted signal will be about 40% of the original signal amplitude. Such an amplitude percentage would be equivalent to an energy conversion of about 16%. In other words, the energy converted will be about 8 db down from the supplied energy.

The edge portions of the delay pads, as well as the lateral edges of the bus bars and (i.e., the edges transverse to the SAW paths of travel) are advantageously provided with two levels of serrations, which substantially reduce SAW reflections from these edges. The serrations include, for example, two superimposed "square waves" having the same pulse height but different pulse periods. For example, the pulse height for both square waves is $\lambda/4$, and the pulse period is $\lambda/3$ for one square wave and $6\lambda$ for the other, where $\lambda$ is the SAW wavelength at 915 MHz. The first level of serrations serves to reduce reflections, while the second level serves to break up the average reflection plane.

The addition of finger pairs to the transducers therefore advantageously increases the energy coupling between electrical energy and SAW energy. However, as explained above in connection with FIGS. 1 and 3, the system according to the invention operates to excite the transducers over a range of frequencies between 905 MHz and 925 MHz. This requires the transducers to operate over a 20–25 MHz bandwidth: a requirement which imposes a constraint upon the number of transducer finger pairs because the bandwidth of a transducer is inversely proportional to its physical width. This relationship arises from the fact that the bandwidth is proportional to $1/\tau$, where $\tau$ is the SAW propagation time from one side of the transducer to the other (the delay time across the transducer).

The transducer may be divided into several separate sections: a central section, two flanking sections and two outer sections. The central section includes interdigital transducer fingers which are alternately connected to two outer bus bars and to a central electrical conductor. This central section comprises a sufficient number of finger pairs to convert a substantial percentage of electrical energy into SAW energy and vice versa. By way of example and not limitation, there may be 12 finger pairs so that the converted amplitude is approximately 24% of the incoming signal amplitude. Flanking the central section, on both sides, are sections containing "dummy" fingers; that is, fingers which are connected to one electrode only and therefore serve neither as transducers nor reflectors. The purpose of these fingers is to increase the width of the transducer so that the outer sections will be spaced a prescribed distance, or SAW delay time, from the central section. For example, there may be 7 dummy fingers (or, more particularly, split fingers) in each of the sections. Finally, each of the outer sections of the transducer contains a single transducer finger pair which is used to shape the bandwidth of the transducer, e.g., maintain an effective bandwidth of about 25 MHz.

The transducer system preferably has an electrical impedance at the design frequency which matches the impedance of the antenna coupling, to maximize the power transfer between the antenna system and transducer. This matching is accomplished by forming series connections of transducer structures, which present as capacitive loads, to reduce impedance, as necessary, and providing heavy metal traces for the bus bars to reduce Ohmic losses. The bus bars are, for example, made approximately twice as thick as the other metallized elements on the substrate.

In practice, the metallization is deposited on the substrate surface using a two-layer photolithographic process. Two separate reticles are used in forming the photolithographic image: one reticle for the transducers, reflectors and phase pads as well as the alignment marks on the substrate, and a separate reticle for the bus bars. The process thus comprises the steps of depositing a 300 Angstrom layer of chromium and then 1000 Angstrom layer of aluminum on the substrate, followed by UV-exposure solubleizing resin spin coating, masking and etching of the bus bars, followed by deposition of 1000 Angstroms of aluminum and another UV activated resin spin coating, masking and etching to form the transducers, reflectors and phase pads as well as the alignment marks on the substrate, doubling the thickness of the bus bar structures.

Each two successive fingers of a transducer may be shorted at one or more locations between the bus bars. The shorts between successive fingers reduce energy loss due to Ohmic resistance of the fingers and render the reflector less susceptible to fabrication errors.

These various techniques and systems, described above, may advantageously be employed or combined with aspects of the present invention in known manner to achieve desired results.

SUMMARY AND OBJECTS OF THE INVENTION

The present invention provides a folded acoustic path which efficiently makes use of the substrate surface area while allowing a relatively large code space. The folded acoustic path is effected by the use of high efficiency reflectors, which allow acoustic path elongation without large substrate linear dimensions.

Advantageously, an acoustic path spirals a peripheral portion of the substrate, and interacts with acoustic structures in a central portion of the substrate to provide an individual response.

Alternately, the acoustic path may zig-zag over the surface of the substrate, guided by reflective elements.

It is therefore an object of the invention to provide an acoustic wave identification transponder device, having a substrate, an electroacoustic transducer generating an acoustic wave in the substrate and a set of encoding elements disposed in a path of the acoustic wave for modifying the acoustic wave, having at least two reflective elements disposed in the acoustic path of the acoustic wave such that an acoustic path length of the acoustic wave on the substrate is longer than twice a largest linear dimension of the substrate. Thus, the acoustic path is "folded" in a manner more complex than a simple reflection.

It is also an object of the invention to provide an acoustic wave identification transponder device, having a substrate, an electroacoustic transducer generating an acoustic wave in the substrate and a set of encoding elements disposed in a path of the acoustic wave for modifying the acoustic wave, and an acoustic path on the substrate having at least two angles, having angle magnitudes whose sum exceeds $\pi$ radians. In this manner, the sum of the magnitudes of all the angles of acoustic reflection is at least 180°.

It is a further object of the present invention to provide an acoustic wave identification transponder having an angled elongated conductor wherein at least one electroacoustic transducer is formed between adjacent portions of the path.

It is a still further object of the present invention to provide an acoustic wave identification transponder having an angled elongated conductor having means for reflecting the acoustic wave to follow a path defined between portions of the angled elongated conductor.

It is another object of the invention to provide an acoustic wave identification transponder having structures disposed in the acoustic path having a transfer function which varies with frequency.

It is also an object of the invention to provide an acoustic wave identification transponder having an angled elongated conductor and having at least two electroacoustic transducers formed between adjacent portions of the path, each of the electroacoustic transducers being disposed in a common portion of the acoustic path.

It is also an object of the invention to provide an acoustic wave identification transponder having an angled elongated conductor and having a structure is provided to reflect the acoustic wave back along its incident path.

It is also an object of the invention to provide an acoustic wave identification transponder having an angled elongated conductor and having a plurality of structures are selectively provided to reflect respective portions of the acoustic wave back along its incident path, the respective portions having differing delay timings.

It is also an object of the invention to provide an acoustic wave identification transponder having an angled elongated conductor and having at least one partially reflective structure is provided, disposed along the acoustic path, to reflect a first portion of the acoustic wave and transmit a second portion the acoustic wave.

It is also an object of the invention to provide an acoustic wave identification transponder having an angled elongated conductor and having a plurality of partially reflective structures, disposed sequentially along the acoustic path, to reflect a first portion of the acoustic wave and transmit a second portion the acoustic wave to an adjacent partially reflective structure.

It is also an object of the invention to provide an acoustic wave identification transponder having an angled elongated conductor and having a plurality of partially reflective structures, disposed sequentially along the acoustic path, to reflect a first portion of the acoustic wave and transmit a second portion the acoustic wave to an adjacent partially reflective structure, the reflected first portion being at an angle different than 180° from the incident acoustic wave.

It is also an object of the invention to provide an acoustic wave identification transponder having an angled elongated conductor and having a plurality of partially reflective structures, disposed sequentially along the acoustic path, to reflect a first portion of the acoustic wave and transmit a second portion the acoustic wave to an adjacent partially reflective structure, the reflected first portion being at an angle of approximately 90° from the incident acoustic wave.

It is also an object of the invention to provide an acoustic wave identification transponder having at least one electroacoustic transducer being associated with an acoustic path, having a plurality of partially reflective structures, disposed sequentially along the acoustic path, to reflect a first portion of the acoustic wave and transmit a second portion the acoustic wave to another partially reflective structure along the acoustic path, the acoustic path being subject to at least two substantially reflecting structures to redirect the acoustic path.

It is also an object of the invention to provide an acoustic wave identification transponder having an mangled elongated conductor and having a plurality of partially reflective structures, disposed sequentially along the acoustic path, to reflect a first portion of the acoustic wave and transmit a second portion the acoustic wave to an adjacent partially reflective structure, the reflected first portion being further directed toward a structure which reflects the acoustic wave back along its incident path.

It is also an object of the invention to provide an acoustic wave identification transponder having an angled elongated conductor and having a structure is disposed along at least one portion of the acoustic path, the structure having reduced acoustic wave propagation velocity as compared to a portion of the substrate absent the structure.

It is also an object of the invention to provide an acoustic wave identification transponder having an angled elongated conductor and having a plurality of structures are disposed along portions the acoustic path, the structures having reduced acoustic wave propagation velocity as compared to a portion of the substrate absent the structures, the structures having a relative disposition to provide a differing delay to respective portions of the acoustic wave.

It is also an object of the invention to provide an acoustic wave identification transponder having an angled elongated conductor which follows a piecewise helical path around a periphery of the substrate.

It is also an object of the invention to provide an acoustic wave identification transponder having an angled elongated conductor and having an acoustic wave which is directed along an acoustic path by corner reflectors.

It is also an object of the invention to provide an acoustic wave identification transponder having an angled elongated conductor, wherein the substrate is a piezoelectric substrate, the acoustic wave being directed along the acoustic path by electroacoustic transducing structures.

It is also an object of the invention to provide an acoustic wave identification transponder having an angled elongated conductor and having a plurality of structures are disposed along portions the acoustic path, the structures having reduced acoustic wave propagation velocity and an acoustic wave specific attenuation which differs from a portion of the substrate absent the structures, the structures having a relative disposition to provide a differing delay and differing attenuation to respective portions of the acoustic wave.

It is also an object of the invention to provide an acoustic wave identification transponder having an angled elongated conductor which is provided such that adjacent portions have a relative phase difference of a radio frequency signal induced therein. The cosine of the relative phase delay is preferably greater than about 0.5.

It is also an object of the invention to provide an acoustic wave identification transponder having an angled elongated conductor and having an acoustic path which comprises a plurality of portions, each portion being adapted for selective modification with a differing combination of phase delay and amplitude alteration, the combination defining the encoding elements, further comprising means for combining the portions of the acoustic path to produce a composite modified acoustic wave. The differing combination of phase delay and amplitude alteration preferably approximates a QAM encoding scheme, and may be, for example, a QAM-16, QAM-18 encoding Polar Modulation scheme, or other regular or irregular signal constellation pattern in phase-amplitude space, with or without missing code modulation spaces.

It is also an object of the invention to provide an acoustic wave identification transponder having an angled elongated conductor and having an antenna for receiving a radio frequency wave for inducing an electric field in the angled elongated conductor, and for reradiating an electric field in the angled elongated conductor as a radio frequency wave.

It is also an object of the invention to provide an acoustic wave identification transponder having an angled elongated conductor, an antenna for receiving a radio frequency wave for inducing an electric field in the angled elongated conductor, and for reradiating an electric field in the angled elongated conductor as a radio frequency wave and having an interrogator for generating a radio wave which is received by the antenna and for receiving the reradiated radio frequency wave, the interrogator being adapted to perform null steered polarization cancellation to differentiate between two acoustic wave identification transponder devices.

It is also an object of the invention to provide an acoustic wave identification transponder having an angled elongated conductor, an antenna for receiving a radio frequency wave for inducing an electric field in the angled elongated conductor, and for reradiating an electric field in the angled elongated conductor as a radio frequency wave and having an interrogator for generating a radio wave having a nonstationary frequency, which is received by the antenna and for receiving the reradiated radio frequency wave, the acoustic wave identification transponder device having a frequency-dependent response.

It is also an object of the invention to provide an acoustic wave identification transponder having an angled elongated conductor, an antenna for receiving a radio frequency wave for inducing an electric field in the angled elongated conductor, and for reradiating an electric field in the angled elongated conductor as a radio frequency wave, wherein the acoustic wave transponder device emits in the radio wave a plurality of representations of the modified acoustic wave having differing delay.

These and other objects will become apparent from a review of the detailed description of the preferred embodiments.

BRIEF DESCRIPTION OF THE DRAWINGS

FIGS. 3A and 3B are time diagrams, drawn to different scales, of the radio frequencies contained in the interrogation and reply signals transmitted with the system of FIG. 1;

FIG. 4 is a block diagram illustrating the decoding process carried out by the signal processor in the system of FIG. 1;

FIG. 5 is a block signal diagram of a passive transponder which may be used with the system of FIG. 1;

FIG. 6 is a plan view, in enlarged scale, of a first configuration of the transponder of FIG. 5;

FIG. 7 is a plan view, in greatly enlarged scale, of a portion of the transponder configuration shown in FIG. 6;

FIG. 14 shows a comparison of compressed pulse shapes for frequency weighting functions;

DETAILED DESCRIPTION OF THE PREFERRED EMBODIMENTS

Figure 1:
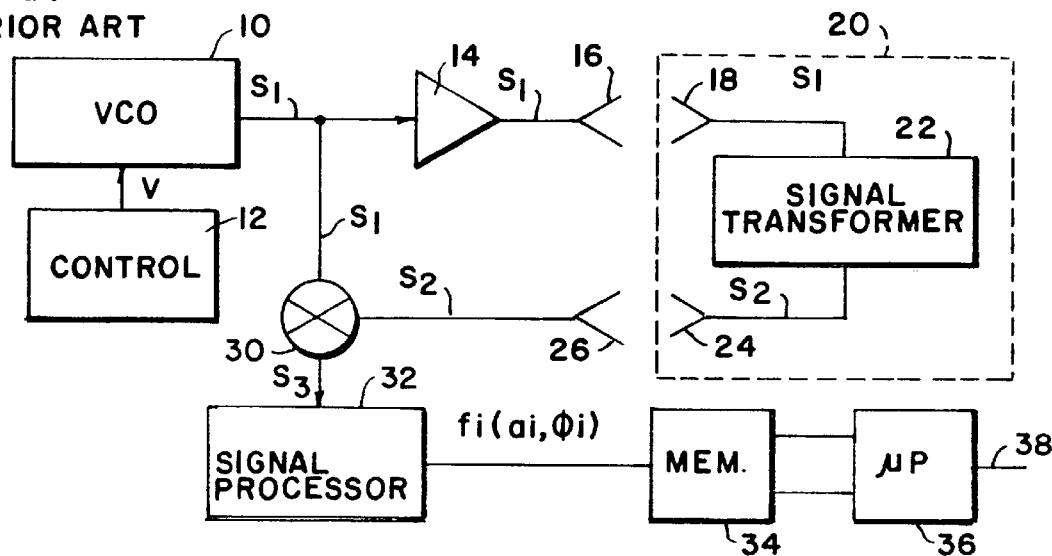
FIG. 1 is a block diagram of a known passive interrogator label system.
Figure 2:
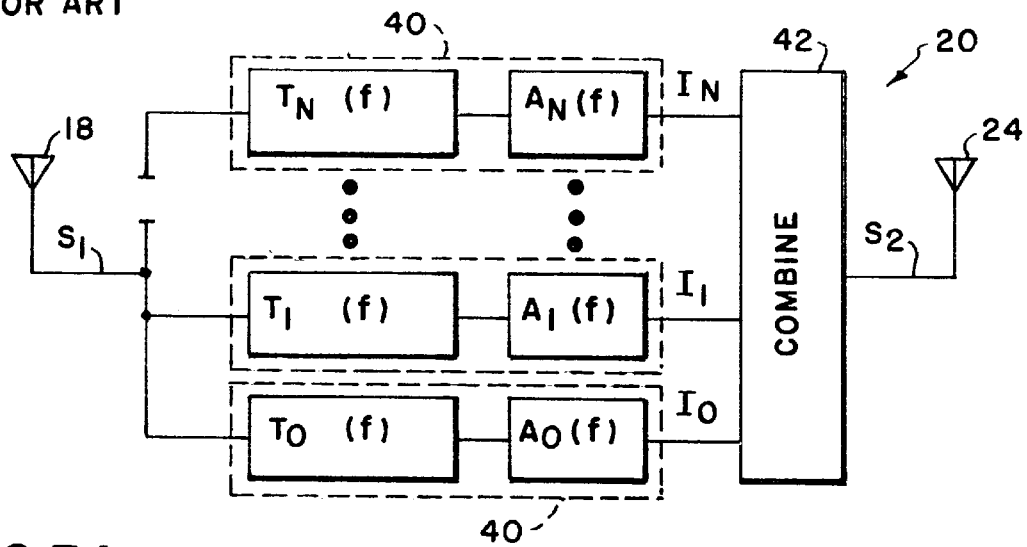
FIG. 2 is a block diagram of a transponder or "label" which is used in the system of FIG. 1.
Figure 3A:
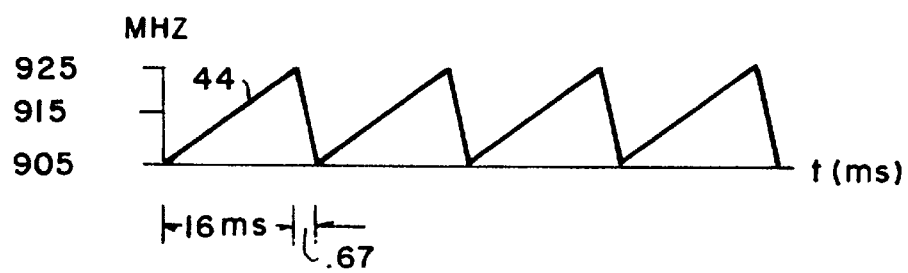
Figure 8A:
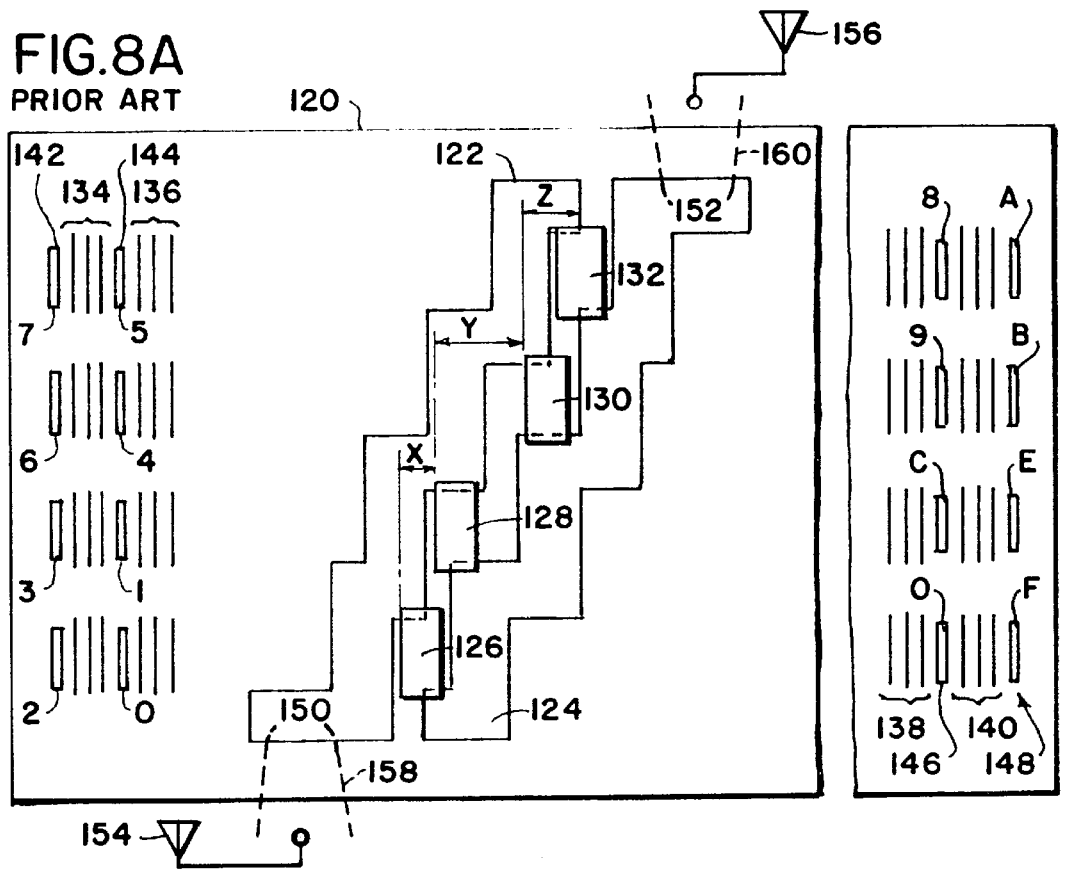
FIGS. 8A and 8B shows a prior art transponder having sets of parallel acoustic paths and reflective elements disposed along the acoustic paths.
Figure 8B:
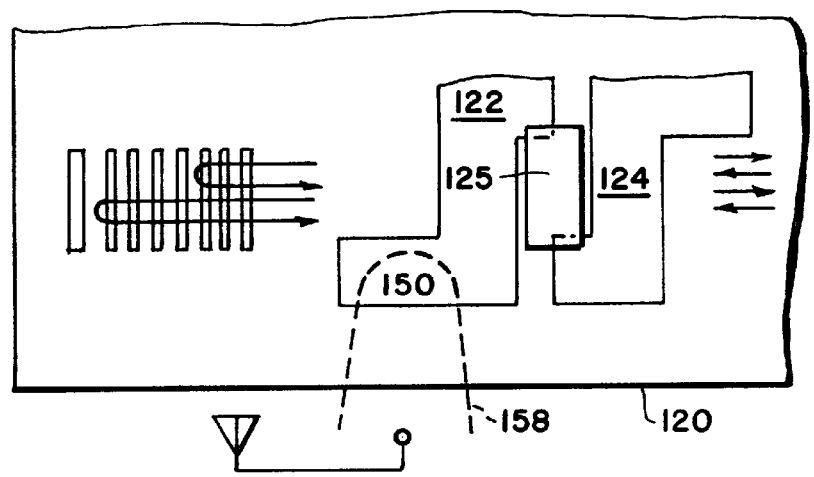

The preferred embodiments of the present invention will now be described with reference to FIGS. 1–18 of the drawings. Identical elements in the various figures are designated with the same reference numerals.

Figures 9A, 9B, 9C, 10A, 10B:
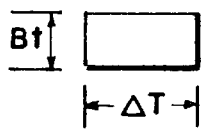
FIGS. 9A–9C show an information cell in time and frequency space, an array of information cells in time and frequency and an array of information cells in time only, respectively.
FIGS. 10A and 10B show modulation patterns in phase-amplitude space for a QAM-16 and QAM-18 polar modulation, respectively.

FIG. 9 shows schematically various schemes for modulating information over a broadband signal. FIG. 9A shows a single information cell, which carries a minimum information packet. Within the scheme, information packets may be placed into differing modulation states over time and frequency, as shown in FIG. 9B. Alternately, information packets may be distributed over time only, as represented in FIG. 9C. Table 1 provides a mathematical analysis of the information packets of an acoustic transponder and limitations on the ability transmit encoded tag information.

FIGS. 10A and 10B show constellation patterns of quadrature amplitude modulation patterns (QAM), in this case QAM-16 and QAM-18 polar modulation. These patterns demonstrate the separation of modulation states by varying phase and amplitude of a signal. Various QAM constellation exist, including rectangular, polar, elliptic, irregular, and those with incomplete code sets. For example, in the QAM-18 scheme, the 0-phase, 0-amplitude code is unused according to the present invention.

Figure 11A:
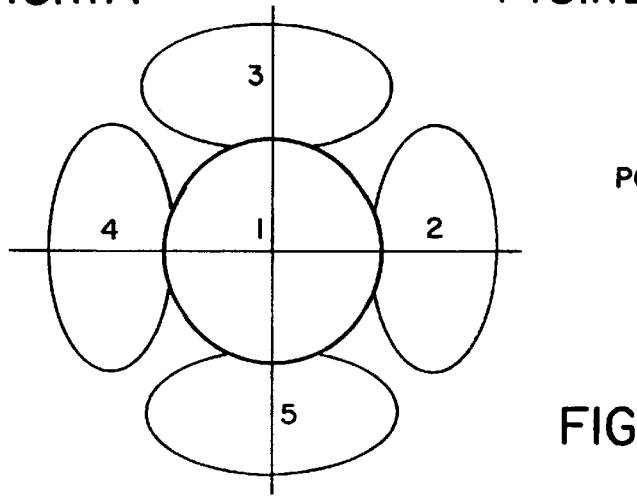
FIGS. 11A–11C show beam coverage using a patch antenna, polarization axes and a representation of multiple readers reading a single tag, respectively.
Figure 11B:
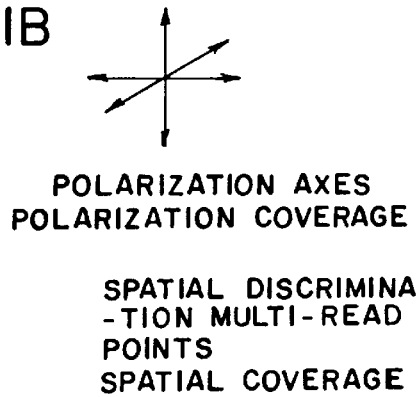
Figure 11C:
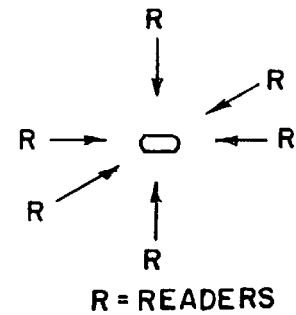
Figure 12A:
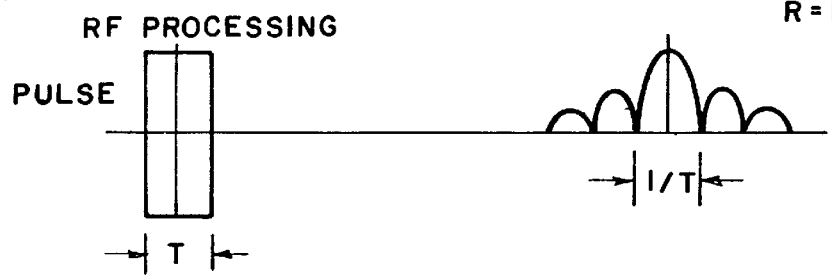
FIGS. 12A–12D show a representation in time and frequency of a pulse, a chirp, and a weighted chirp impulse, respectively.
Figure 12B:
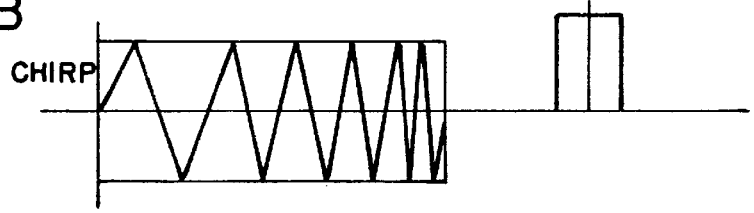
Figure 12C:
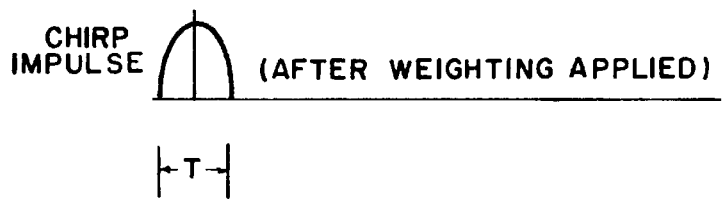
Figure 12D:
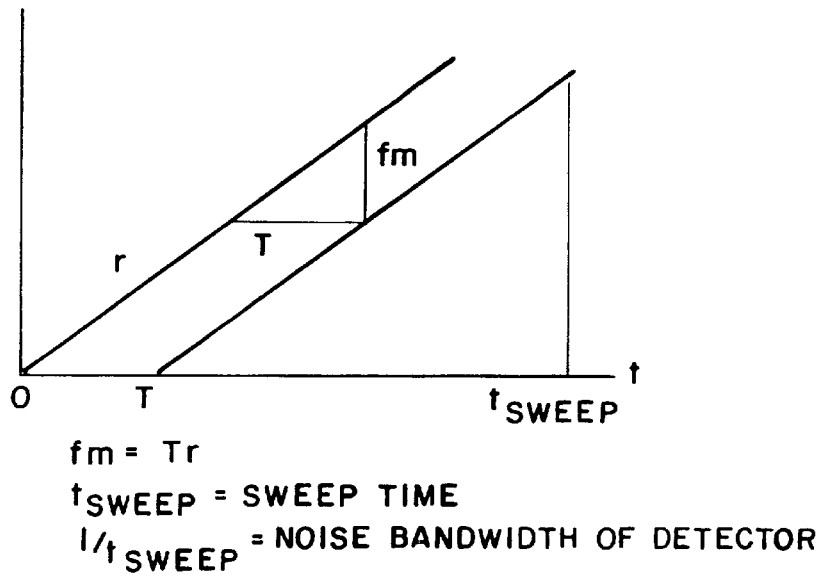

FIGS. 11A–11C show a beam coverage pattern for a patch-like antenna, polarization axes and potential for spatial discrimination of a tag. By providing lobular and polarized radio frequency transmission patterns, tags in proximity to an interrogation system may be distinguished. For example, where two tags have slightly differing orientations within the interrogation field, a null steered polarization technique may be used. In this case, one transponder produces a substantial output while another transponder is at a "null" or relatively low output level. This may be achieved by differential phase delays, group delays, or frequency responses, for example. Active phased array antennas may also be employed. As an example of this is, a unique set of three different delays associated with any one tag may be provided. Similar diversity may also be proposed in the frequency domain.

The polarization null steering relies on the assumption that each tag has been randomly placed on the article to be identified. The interrogator then excites the environment with two orthogonal linear polarized RF beams. All tags will respond to some degree in the two polarizations. If an algorithm is used where the two orthogonal components are combined vectorially to achieve at one moment some particular polarization, then the response will be that due to the assembly of all the tags. If the vector is now rotated, for example, by 5 degrees and the new resultant determined, then if one of the tags happens to fall in the null so created then there will be a substantial difference been the new resultant and the previous resultant where the difference will be the value of the tag just nulled out. All other tags will only change slowly in their level since they are presumably not near their individual null.

Figure 13:
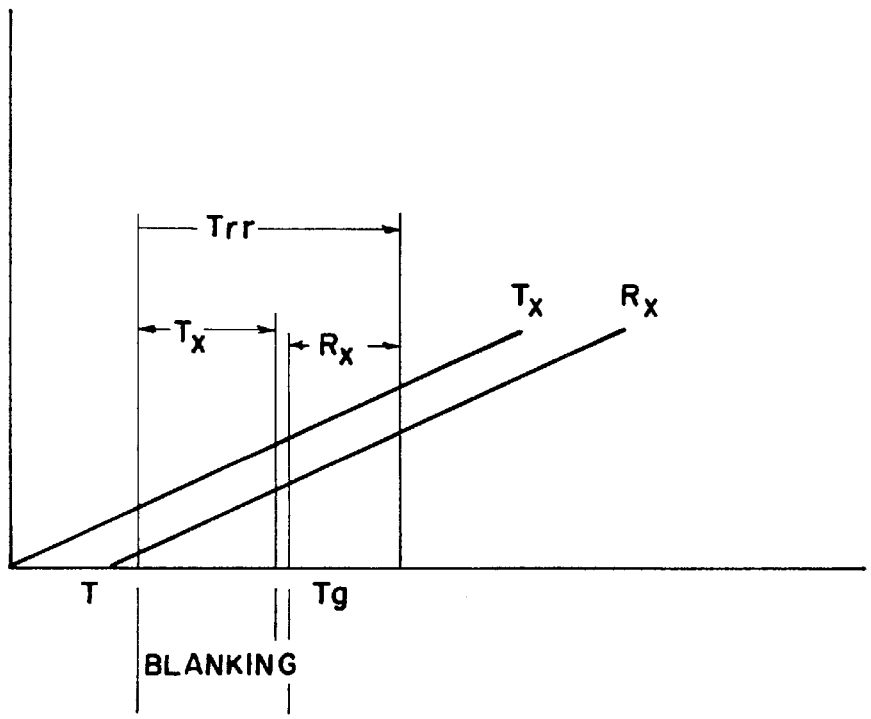
FIG. 13 shows a graph of superposed transmitted and received waveforms in frequency domain from an acoustic wave transponder.
Figures 15, 16:
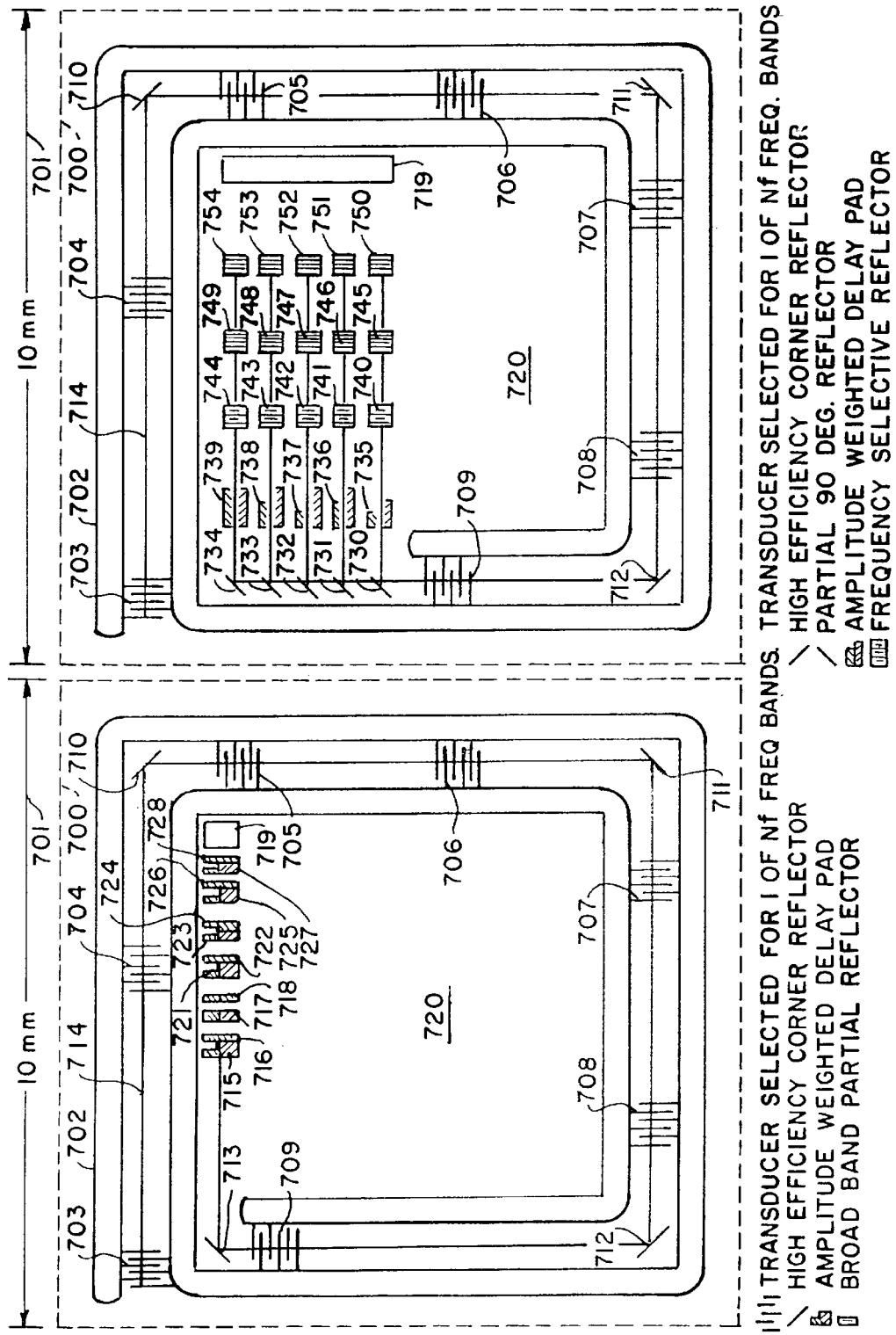
FIGS. 15–18 show differing embodiments of acoustic transponder tags according to the present invention having a wrapped acoustic path.
Figure 18:
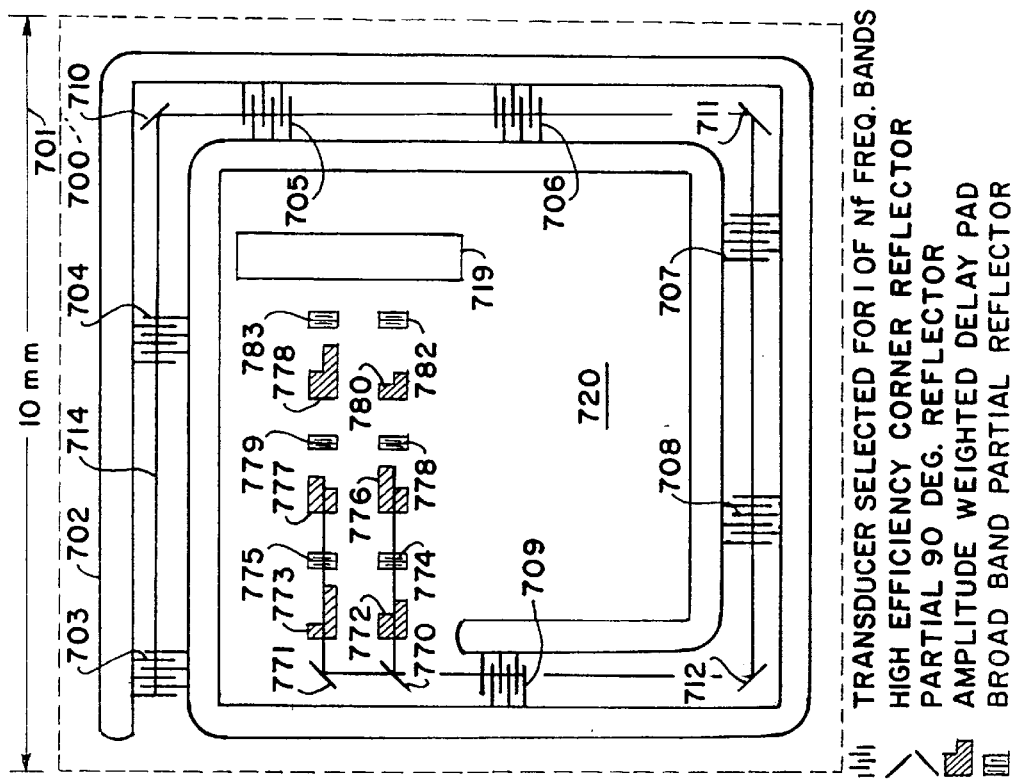
Figure 17:
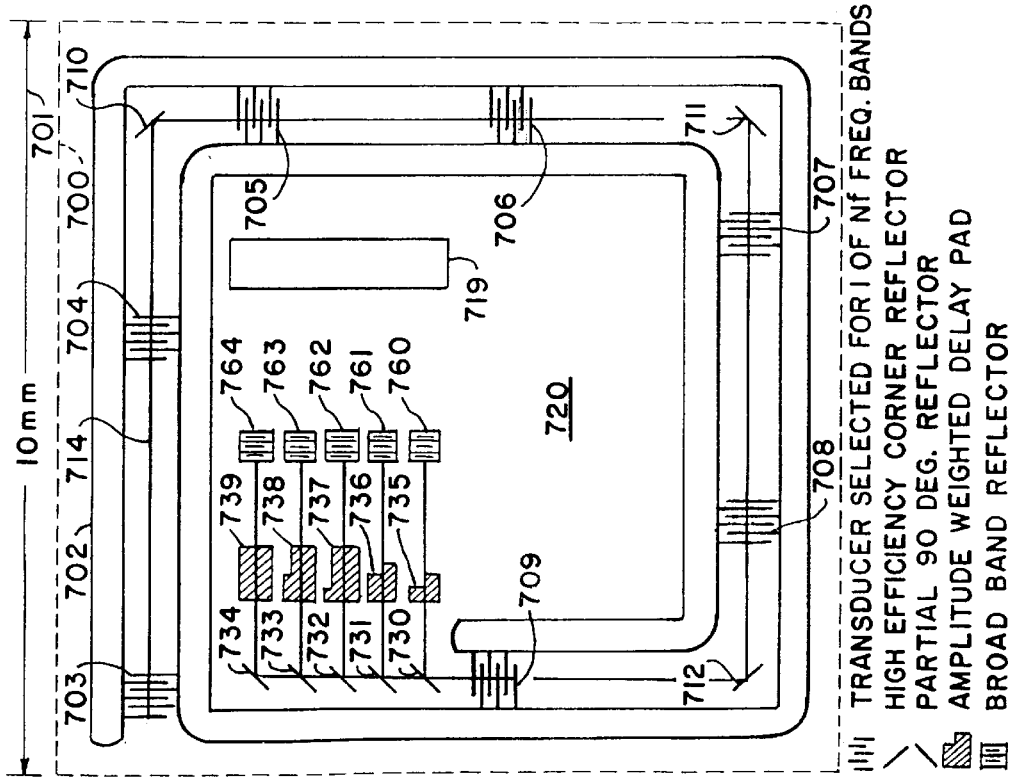

FIG. 12A–12D show time and frequency domain representations, respectively, of a pulse, a chirp, and a shaped chirp. Based on these transformations, it is well known how to extract information modulated as delay factors from an information signal. FIG. 13 shows, more specifically, how a chirp waveform, assuming a delay in the transponder, allows separation of the transmitted and received information signals. FIG. 14 shows the effect of pulse shaping on the spectral characteristics of a signal. For example, Hamming weighting produces lower sidelobe amplitude than a uniform weighting, with Taylor weighting being intermediate.

FIGS. 15–18 show differing embodiments of the acoustic transponder tag according to the present invention. The thick dark line 702 represents the buss bar that drives the transducers 703, 704, 705, 706, 707, 708, 709. The bus bar 702 is laid out in the manner shown so as to enable the RF energy to be inductively coupled into the buss bar 702. As the buss bar 702 passes around the square substrate 700, having a side length of about 10 mm, for the second time it provides the means of driving the transducer 703, 704, 705, 706, 707, 708, 709 located at that respective location with the appropriate differential signal. Each transducer 703, 704, 705, 706, 707, 708, 709 so placed will split the available RF power equally in accord with the number of transducers. This same power loss will be sustained again on the reflected path, i.e. the overall loss due to the split will be 20 log(N). Table 2 provides, in more detail, an analysis of the signal strength of the received signal. Hence the number of transducers should be minimized to maintain high signal amplitudes. The energy, once launched from the transducers 703, 704, 705, 706, 707, 708, 709 will follow the acoustic path 714, indicated as a dotted line, around, reflecting 90 degrees at each corner 710, 711, 712, 713 (FIG. 15) until it reaches the partial reflectors 730, 731, 732, 733, 734, 770, 771 shown in FIGS. 16–18, where the energy will be split evenly into several parallel acoustic paths. In FIG. 35, no partial reflectors are provided and the acoustic paths are thus superposed. At this location the individual tag code is determined. The amplitude weighted delay pads 715, 717, 721, 723, 725, 727, 735, 736, 737, 738, 739, 772, 773, 776, 777, 780, 781 independently shift the phase and attenuate the acoustic energy. The Acoustic energy is reflected off sets of reflectors, which may be broadband 716, 718, 722, 724, 726, 728, 760, 761, 762, 763, 764, 774, 775, 778, 779, 782, 783 or frequency selective 740, 741, 742, 743, 744, 745, 746, 747, 748, 749. Each set of reflectors in any one path is identical to all the others. Any unreflected energy is absorbed in the absorber 719 shown. The acoustic energy then re-travels the path by which it came finally re-exciting the transducers 703, 704, 705, 706, 707, 708, 709 and hence the buss bar 702, thus finally inductively coupling back into the antenna structure (not shown). The delay and signal loss from a surface acoustic wave transponder system are analyzed in more detail in Table 3.

The code is uniquely determined in the code section 720 and then replicated in the time domain depending on which transducers 703, 704, 705, 706, 707, 708, 709 are selected to remain on the structure. Similarly the code is replicated in the frequency domain depending on which reflectors 716, 718, 722, 724, 726, 728, 760, 761, 762, 763, 764, 774, 775, 778, 779, 782, 783, 740, 741, 742, 743, 744, 745, 746, 747, 748, 749 are selected to remain. It is assumed that reflectors of the same frequency will be selected the same for all the split acoustic paths.

While the structure in the code section is of critical dimensions, the placement of the transducers is not critical, and therefore nominal positioning is sufficient. Selection of the transducers and reflectors is achieved by selective etching of the unwanted component, in a secondary processing operation.

Figure 19A:
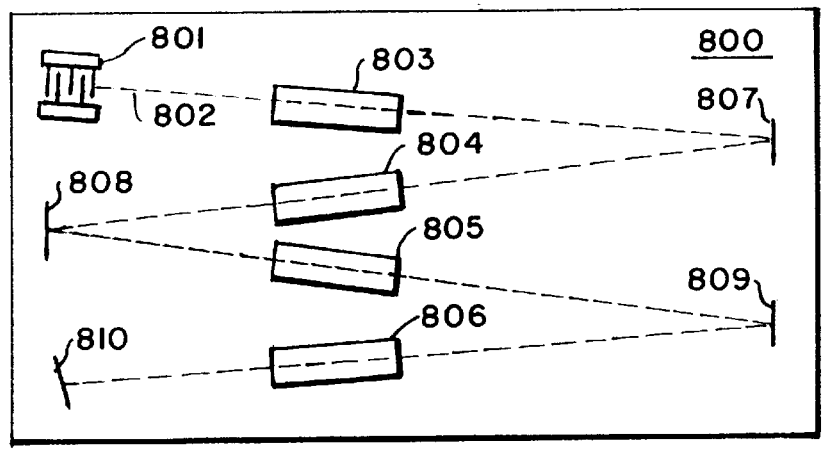
FIGS. 19A–19C show differing embodiments of the acoustic transponder tags according to the present invention having a multiply reflected path.
Figure 19B:
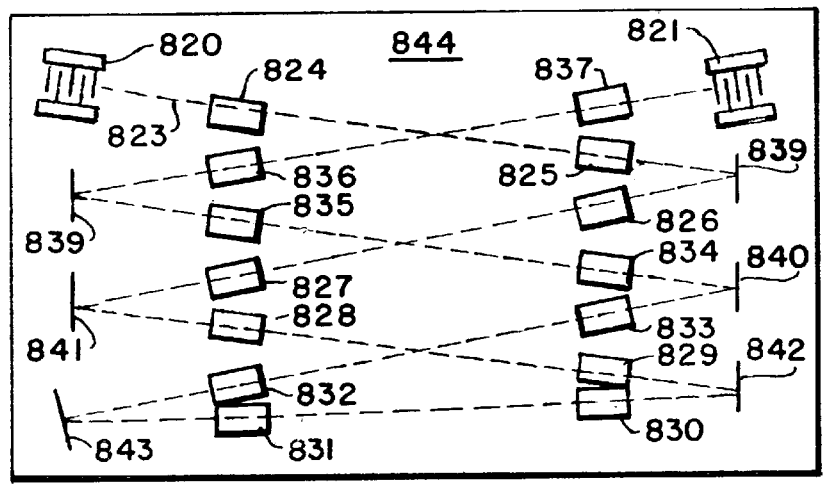
Figure 19C:
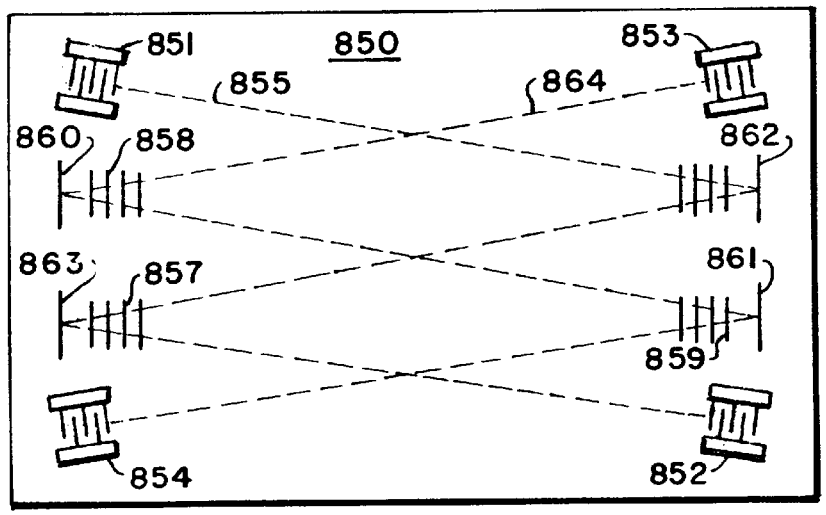

FIGS. 19A–19C show an embodiment of the invention employing folded acoustic paths. FIG. 19A provides a single transducer 801 on substrate 800 producing acoustic wave 802. Acoustic wave 802 encounters sets of wave perturbation elements 803, 804, 805, 806 along its path, which impart a characteristic encoding. Between respective sets of wave perturbation elements 803, 804, 805, 806 are reflectors 807, 808, 809, 810 respectively which direct the acoustic wave 802 along a desired path. Reflective element 810 redirects the wave along its incident path.

FIG. 19B is similar in concept to FIG. 19A, except the acoustic wave is directed to a different transducer. Thus, transducers 820, 821 are each provided on substrate 844. Acoustic wave 823 is directed between the two transducers 820, 821, guided by reflective elements 838, 839, 840, 841, 842, 843. Sets of wave perturbation elements 824, 825, 826, 827, 828, 829, 830, 831, 832, 833, 834, 835, 836, and 837 produce a characteristic encoding of the acoustic wave 823.

FIG. 19C is similar to FIGS. 19A and 19B, but provides a plurality of acoustic paths. Transducers 851 and 852 form one acoustic path 855, and transducers 853 and 854 form another acoustic path 864. Acoustic path 855 encounters reflective elements 862 and 863, as well as sets of wave perturbation elements 856 and 857 which produce a characteristic encoding. Likewise, acoustic path 864 encounters reflective elements 860 and 861, as well as sets of wave perturbation elements 858 and 859 which produce a characteristic encoding.

There has thus been shown and described a novel acoustic transponder substrate, and an RF-ID transponder produced with such a substrate, which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

TABLE 1

The ability to replicate a 'tag' in time and frequency space depends upon the following parameters:
Available frequency bandwidth
Achieveable time delay spread
Time delay and frequency space required for the unique tag code Let:

| | | |
|---|---|---|
| Nc | = | number of code bits per time domain 'tap' |
| Nt | = | number of taps per unique code |
| Nf | = | number of discrete frequency intervals available |
| Nb | = | number of RF beams |
| Np | = | number of polarization nulls possible |
| Nd | = | number of degrees of freedom |
| Bw | = | total bandwidth available (MHz) |
| Bt | = | bandwidth per tap (MHz) |
| Tf | = | shortest time delay available ($\mu$s) |
| Tl | = | longest time delay available ($\mu$s) |
| Se | = | spectral efficiency (typically 1.2 to 1.5) |

Then:

$$Nd = Nf * Nt * Nb * Np$$
$$= \frac{(Tl - Tf) * Bw * Nb * Np}{Se}$$

Example:

| | | |
|---|---|---|
| Bw | = | 25 MHz |
| Tf | = | 20 $\mu$s |
| Tl | = | 3 $\mu$s |
| Se | = | 1.2 |
| Nb | = | 5 (typical patch directivity related) |
| Np | = | 16 (20 dB cancellation) |
| | | 50 (30 dB cancellation) |
| Nd | = | $\frac{17 * 25}{1.2}$ * Nb * Np |
| | = | 354 * Nb * Np |
| | = | 28320 (20 dB cancellation) |
| | = | 88500 (30 dB cancellation) |

The above examples are based on a SAW system operating in the 915 MHz ISM band using a practical geometry not exceeding 10 mm square.

TABLE 2

LINK ANALYSIS

| | | | |
|---|---|---|---|
| Let | Pt | = | Transmit power dBm |
| | Pr | = | Received reflected power dBm |
| | Gt | = | Tag antenna gain dBi |
| | Gr | = | Reader antenna gain (Tx & Rx) dBi |
| | R | = | Radial range between reader and tag (feet) |
| | $\lambda$ | = | Wavelength (feet) |
| | Lsaw | = | Internal loss in SAW for single tap |
| | $\tau$ | = | Delay for single tap $\mu$s |
| | $\tau_g$ | = | Delay for blanking range gate (for chopped chirp) $\mu$s |
| | Prf | = | Pulse repetition frequency (for chopped chirp) |

Link Equation:

| | | | |
|---|---|---|---|
| | Pr | = | Pt + 2 Gt + 2 Gr − 40 log (4$\pi$R/$\lambda$) − 20 log [($\tau - \tau_g$)Prf] − Lsaw |
| If: | Pt | = | 10 dBm |
| | Gt | = | 2 dBi |
| | Gr | = | 8 dBi |
| | Lsaw | = | 23 dB (@ 3 $\mu$s) |
| | | = | 38 dB (@ 23 $\mu$s) |
| | $\tau_g$ | = | 1 $\mu$s |
| | R | = | 30 feet |
| | $\lambda$ | = | 1.075 feet (915 MHz) |

TABLE 2-continued

```
Then:
        Pr    =   -95 dBm (@ 3 μs)      continuous chirp
              =   -110 dBm (@ 23 μs)    continuous chirp
              =   -123 dBm (@ 3 μs)     chopped chirp
              =   -117 dBm (@ 23 μs)    chopped chirp
Calculation of NOISE at detector output:
    Let:
        Pn    =   noise power dBm
        NF    =   Noise Figure for front end receiver
        No    =   Thermal noise spectral density at 20° C.
              =   -174 dBm/Hz
        Bd    =   Bandwidth of detector
    Then:
        Pn    =   No + 10 log (Bd) + NF
    If:
        Bd    =   4 Hz appropriate for 4 frequency bands and 1s
                  sweep rate
    Then:
        Pn    =   -158 dBm    without noise blanking for
                              chopped chirp
              =   -161 dBm    with noise blanking and
                              chopped chirp
Comparison for 30 feet read range
    Pr          Pn          S/N     conditions
    -95 dBm     -158 dBm    63 dB   (@ 3 μs) continuous chirp
    -110 dBm    -158 dBm    48 dB   (@ 23 μs) continuous chirp
    -123 dBm    -161 dBm    38 dB   (@ 3 μs) chopped chirp
    -117 dBm    -161 dBm    44 dB   (@ 23 μs) chopped chirp
Discrete echoes may be a problem of large planar structures facing the
read point or inside right angle corners formed by large planar structures.
    Echo level Pe is:
        Pe    =   Pt + 2 Gr - 20 log (4πrf) - Dc
    Where:
        Dc    =   Diffraction correction
              =   0 dB if structure size > square root (τcλ)
        c     =   speed of light 1000 feet/μs
    Objects much smaller than the above become scatters and
    the above equation does not apply.
Reverberation is associated with diffuse echoes that have been reflected
many times. Based on typical field measurements from [the] an existing
[X-cyte] system (X-Cyte Inc., San Jose CA), the reverberation can be
found to be:
        Prev  =   Reverberation (for 100 ns impulse width)
        Prev  =   Pt - 65 - 10τ - 20 log [(τ- τ_g)
                  Prf]       bad environment
              =   Pt - 110 - 10τ - 20 log [(τ- τ_g)
                  Prf]       typical environment
        Prf   =   Pulse repetition frequency for chopped
                  chirp (50 kHz)
```

TABLE 3

```
SAW delay analysis:
        τ     =   d(Φr + Φt)/dω + 2 Vt/c +
                  (τi + τc + τm)(1 + [T - To]α)
        ω     =   2 π (fo + f t)
        Vd    =   detector output
              =   Vr exp(j ω τ)
              =   Vr exp(jΦr + jΦt + jω₀2Vt/c + jω₀τs +
                  j2πft²2V/c + j2πfτs)
Loss:
        Lsaw  =   ατ + Lo + Ls + Lr
    Where:
        α     =   acoustic attenuation dB/μs
              =   0.75 dB/μs
        Lo    =   Ohmic loss
              =   3 dB
        Ls    =   Transducer splitting loss (due to two way
                  acoustic path)
              =   6 dB
        Lr    =   Reflection loss off reflector
              =   12 dB typ.
        Lsaw  =   23 dB (3 μs)
              =   38 dB (23 μs)
```

What is claimed is:

1. An acoustic wave identification transponder device, having a substrate, an electroacoustic transducer generating an acoustic wave in said substrate and a set of encoding elements disposed in a path of the acoustic wave for modifying the acoustic wave, wherein the improvement comprises:

at least two reflective elements disposed in the acoustic path of the acoustic wave such that an acoustic path length of the acoustic wave on the substrate is longer than twice a largest linear dimension of the substrate.

2. An acoustic wave identification transponder device, having a substrate, an electroacoustic transducer generating an acoustic wave in said substrate and a set of encoding elements disposed in a path of the acoustic wave for modifying the acoustic wave, wherein the improvement comprises:

an acoustic path on said substrate, having at least two angles, said at least two angle having a sum of angles magnitudes greater than $\pi$ radians.

3. The acoustic wave identification transponder device according to claim 2, wherein at least one electroacoustic transducer is formed between adjacent portions of said path.

4. The acoustic wave identification transponder device according to claim 2, further comprising an angled elongated conductor, and means for reflecting the acoustic wave to follow a path defined by said angled elongated conductor.

5. The acoustic wave identification transponder device according to claim 2, further comprising structures disposed in the acoustic path having a transfer function which varies with frequency.

6. The acoustic wave identification transponder device according to claim 2, wherein at least two electroacoustic transducers are formed between adjacent portions of said path, each of said electroacoustic transducers being disposed in a common portion of the acoustic path.

7. The acoustic wave identification transponder device according to claim 2, wherein a structure is provided to reflect the acoustic wave back along its incident path.

8. The acoustic wave identification transponder device according to claim 2, wherein a plurality of structures are selectively provided to reflect respective portions of the acoustic wave back along its incident path, said respective portions having differing delay timings.

9. The acoustic wave identification transponder device according to claim 2, wherein at least one partially reflective structure is provided, disposed along the acoustic path, to reflect a first portion of the acoustic wave and transmit a second portion said acoustic wave.

10. The acoustic wave identification transponder device according to claim 2, wherein a plurality of partially reflective structures are provided, disposed sequentially along the acoustic path, to reflect a first portion of the acoustic wave and transmit a second portion said acoustic wave to an adjacent partially reflective structure.

11. The acoustic wave identification transponder device according to claim 2, wherein a plurality of partially reflective structures are provided, disposed sequentially along the acoustic path, to reflect a first portion of the acoustic wave and transmit a second portion said acoustic wave to an adjacent partially reflective structure, said reflected first portion being at an angle different than 180°.

12. The acoustic wave identification transponder device according to claim 2, wherein a plurality of partially reflective structures are provided, disposed sequentially along the acoustic path, to reflect a first portion of the acoustic wave and transmit a second portion said acoustic wave to an adjacent partially reflective structure, said reflected first portion being at an angle of approximately 90°.

13. The acoustic wave identification transponder device according to claim 2, wherein a plurality of partially reflective structures are provided, disposed sequentially along the acoustic path, to reflect a first portion of the acoustic wave and transmit a second portion said acoustic wave to an adjacent partially reflective structure, said reflected first portion being farther directed toward a structure which reflects the acoustic wave back along its incident path.

14. The acoustic wave identification transponder device according to claim 2, wherein a structure is disposed along at least one portion of the acoustic path, said structure having reduced acoustic wave propagation velocity as compared to a portion of the substrate absent said structure.

15. The acoustic wave identification transponder device according to claim 2, wherein a plurality of structures are disposed along portions the acoustic path, said structures having reduced acoustic wave propagation velocity as compared to a portion of the substrate absent said structures, said structures having a relative disposition to provide a differing delay to respective portions of the acoustic wave.

16. The acoustic wave identification transponder device according to claim 2, further comprising an angled elongated conductor follows a piecewise helical path around a periphery of the substrate.

17. The acoustic wave identification transponder device according to claim 2, wherein the acoustic wave is directed along the acoustic path by corner reflectors.

18. The acoustic wave identification transponder device according to claim 2, wherein the substrate is a piezoelectric substrate, the acoustic wave being directed along the acoustic path by electroacoustic transducing structures.

19. The acoustic wave identification transponder device according to claim 2, wherein a plurality of structures are disposed along portions of the acoustic path, said structures having reduced acoustic wave propagation velocity and an acoustic wave specific attenuation which differs from a portion of the substrate absent said structures, said structures having a relative disposition to provide a differing delay and differing attenuation to respective portions of the acoustic wave.

20. The acoustic wave identification transponder device according to claim 2, further comprising an angled elongated conductor, provided on said substrate such that adjacent portions of said angled elongated conductor interrupted by an area of said substrate absent said angled elongated conductor have a relative phase difference of a radio frequency signal induced therein.

21. The acoustic wave identification transponder device according to claim 20, wherein a cosine of said relative phase delay is greater than about 0.5.

22. The acoustic wave identification transponder device according to claim 2, wherein the acoustic path comprises a plurality of portions, each portion being adapted for selective modification with a differing combination of phase delay and amplitude alteration, said combination defining the encoding elements, further comprising means for combining said portions of said acoustic path to produce a composite modified acoustic wave.

23. The acoustic wave identification transponder device according to claim 22, wherein said differing combination of phase delay and amplitude alteration approximates a QAM encoding scheme.

24. The acoustic wave identification transponder device according to claim 22, wherein said differing combination of phase delay and amplitude alteration approximates a QAM-16 encoding scheme.

25. The acoustic wave identification transponder device according to claim 22, wherein said differing combination of phase delay and amplitude alteration approximates a QAM-18 encoding Polar Modulation scheme.

26. The acoustic wave identification transponder device according to claim 2, further comprising an angled elongated conductor on said substrate and an antenna for receiving a radio frequency wave, for inducing an electric field in said angled elongated conductor, and for reradiating an electric field in said angled elongated conductor as a radio frequency wave.

27. The acoustic wave identification transponder device according to claim 26, further comprising an interrogator for generating a radio wave which is received by said antenna and for receiving said reradiated radio frequency wave, said interrogator being adapted to perform null steered polarization cancellation to differentiate between two acoustic wave identification transponder devices.

28. The acoustic wave identification transponder device according to claim 26, further comprising an interrogator for generating a radio wave having a non-stationary frequency, which is received by said antenna and for receiving said reradiated radio frequency wave, said acoustic wave identification transponder device having a frequency-dependent response.

29. The acoustic wave identification transponder device according to claim 26, wherein said acoustic wave transponder device emits in said radio wave as a plurality of representations of the modified acoustic wave having differing delay.

* * * * *